United States Patent
Ueno et al.

(10) Patent No.: US 11,516,884 B2
(45) Date of Patent: Nov. 29, 2022

(54) LIGHT IRRADIATION TYPE HEAT TREATMENT METHOD AND HEAT TREATMENT APPARATUS THAT CALCULATES A TEMPERATURE OF A SUBSTRATE BASED ON A TREATMENT RECIPE APPLICABLE THERETO

(71) Applicant: SCREEN Holdings Co., Ltd., Kyoto (JP)

(72) Inventors: Tomohiro Ueno, Kyoto (JP); Takayuki Aoyama, Kyoto (JP); Mao Omori, Kyoto (JP); Takahiro Kitazawa, Kyoto (JP); Katsuichi Akiyoshi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 241 days.

(21) Appl. No.: 16/699,812

(22) Filed: Dec. 2, 2019

(65) Prior Publication Data
US 2020/0196389 A1 Jun. 18, 2020

(30) Foreign Application Priority Data

Dec. 12, 2018 (JP) .............................. JP2018-232317
Dec. 12, 2018 (JP) .............................. JP2018-232468

(51) Int. Cl.
*H05B 1/02* (2006.01)
*H05B 3/00* (2006.01)
(Continued)

(52) U.S. Cl.
CPC ...... *H05B 1/0233* (2013.01); *H01L 21/67115* (2013.01); *H05B 3/0047* (2013.01); *F27D 21/0014* (2013.01)

(58) Field of Classification Search
CPC .... G01N 21/31; H05B 3/0047; H05B 1/0233; H01L 21/67098; H01L 21/67115;
(Continued)

(56) References Cited

U.S. PATENT DOCUMENTS 5,595,916 A 1/1997 Fujimura et al.
2005/0018196 A1* 1/2005 Kusuda ............ H01L 21/67248
356/448

(Continued)

FOREIGN PATENT DOCUMENTS

JP H06-341952 A 12/1994
JP 2000-252227 A 9/2000
(Continued)

OTHER PUBLICATIONS

Office Action dated Aug. 4, 2020 in counterpart Taiwanese Patent Application No. 108141112 and Search Report with partial English translation based on attached Japanese translation.
(Continued)

*Primary Examiner* — John P. Dulka
(74) *Attorney, Agent, or Firm* — Ostrolenk Faber LLP

(57) ABSTRACT

A carrier containing a plurality of semiconductor wafers in a lot is transported into a heat treatment apparatus. Thereafter, a recipe specifying treatment procedures and treatment conditions is set for each of the semiconductor wafers. Next, a reflectance of each of the semiconductor wafers stored in the carrier is measured. Based on the set recipe and the measured reflectance of each semiconductor wafer, a predicted attainable temperature of each semiconductor wafer at the time of flash heating treatment is calculated, and the calculated predicted attainable temperature is displayed. This allows the setting of the treatment conditions with
(Continued)

reference to the displayed predicted attainable temperature, to thereby easily achieve the setting of the heat treatment conditions.

12 Claims, 19 Drawing Sheets

(51) Int. Cl.
*H01L 21/67* (2006.01)
*F27D 21/00* (2006.01)

(58) Field of Classification Search
CPC .......... H01L 21/2636; H01L 21/67242; H01L 21/67248; H01L 22/10; H01L 22/12; H01L 22/20; F27D 21/0014
See application file for complete search history.

(56) References Cited

U.S. PATENT DOCUMENTS

| | | |
|---|---|---|
| 2007/0003259 A1 | 1/2007 | Kaihori |
| 2007/0020784 A1 | 1/2007 | Timans |
| 2008/0019679 A1 | 1/2008 | Kubo |
| 2013/0245978 A1 | 9/2013 | Chen et al. |
| 2017/0053818 A1 | 2/2017 | Aoyama |

FOREIGN PATENT DOCUMENTS

| | | | |
|---|---|---|---|
| JP | 2007-013047 A | | 1/2007 |
| JP | 2009-500851 A | | 1/2009 |
| JP | 2009-231652 A | | 10/2009 |
| JP | 2009231652 A | * | 10/2009 |
| JP | 2010-238767 A | | 10/2010 |
| JP | 2011-009679 A | | 1/2011 |
| JP | 2011-210768 A | | 10/2011 |
| JP | 2014-045067 A | | 3/2014 |
| JP | 2015-130423 A | | 7/2015 |
| JP | 2017-041468 A | | 2/2017 |
| KR | 10-2013-0105237 A | | 9/2013 |
| KR | 10-1547318 B1 | | 8/2015 |

OTHER PUBLICATIONS

Notification of Reason for Refusal dated Jul. 19, 2021 in counterpart Korean Patent Application No. 10-2019-0164646 with English translation obtained from One Portal Dossier.
Decision of Grant dated Dec. 20, 2021 in counterpart Korean Patent Application No. 10-2019-0164646.
Decision of Refusal dated Jan. 13, 2021 in corresponding Taiwanese Patent Application No. 108141112 with partial English translation based on attached Japanese translation.
Notice of Reasons for Refusal dated May 17, 2022 in counterpart Japanese Patent Application No. 2018-232317 and English translation obtained from One Portal Dossier.
Notice of Reasons for Refusal dated May 31, 2022 in counterpart Japanese Patent Application No. 2018-232468 and English translation obtained from One Portal Dossier.
Korean Notification of Reason for Refusal dated Jun. 7, 2022 in counterpart Korean Patent Application No. 10-2022-0027468 and English translation obtained from One Portal Dossier.
Office Action with Search Report dated Aug. 29, 2022 in counterpart Taiwanese Patent Application No. 108141112 and partial English translation based on Japanese translation of the original communication.
Notice of Reasons for Refusal dated Sep. 27, 2022 in counterpart Japanese Patent Application No. 2018-232317 and English translation obtained from One Portal Dossier.

* cited by examiner

F I G. 6
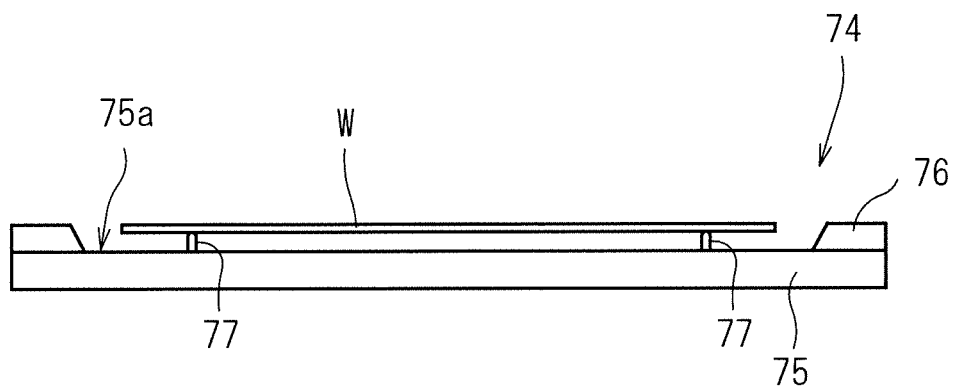

F I G. 7
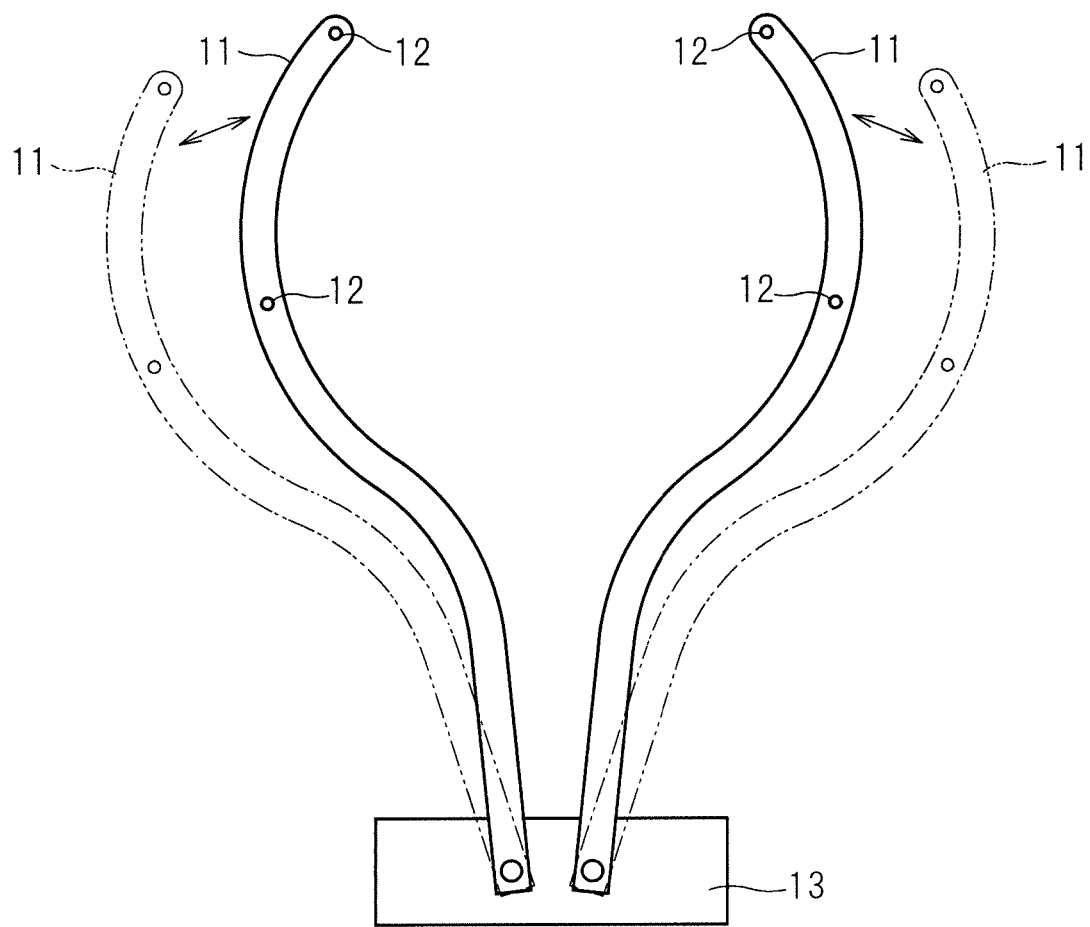

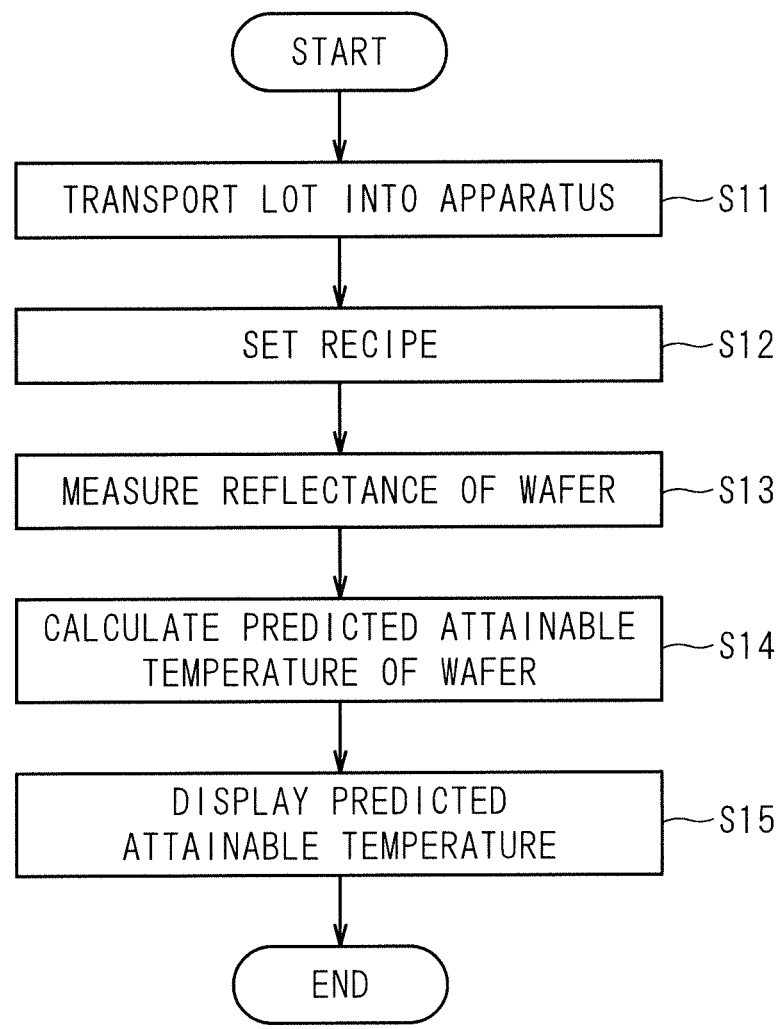

F I G . 1 2

|       | Reflect | Recipe | Peak Temperature |
|-------|---------|--------|------------------|
| ID    |         |        |                  |
| slot1 | ☐ | ☐ | ☐ |
| slot2 | ☐ | ☐ | ☐ |
| slot3 | ☐ | ☐ | ☐ |
| slot4 | ☐ | ☐ | ☐ |
| slot5 | ☐ | ☐ | ☐ |
| ...   |   |   |   |
| slot25 | ☐ | ☐ | ☐ |

F I G. 1 5
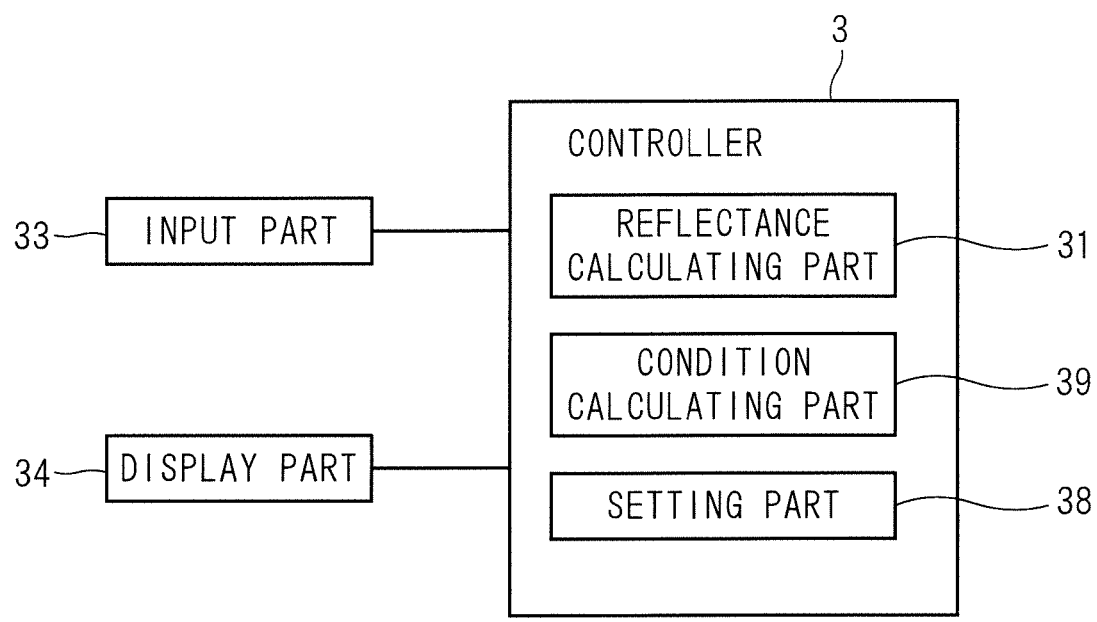

F I G . 1 7
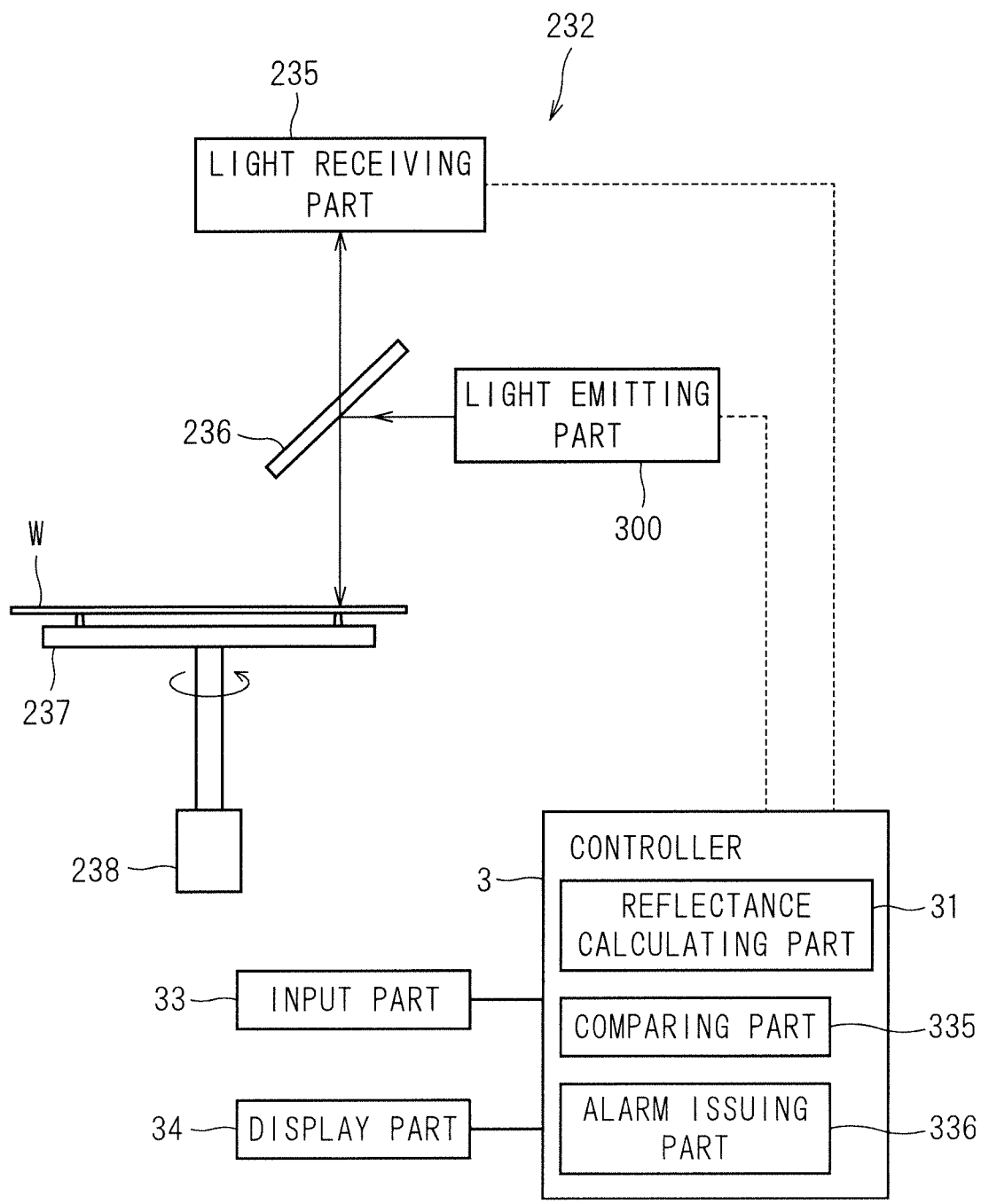

F I G. 1 8
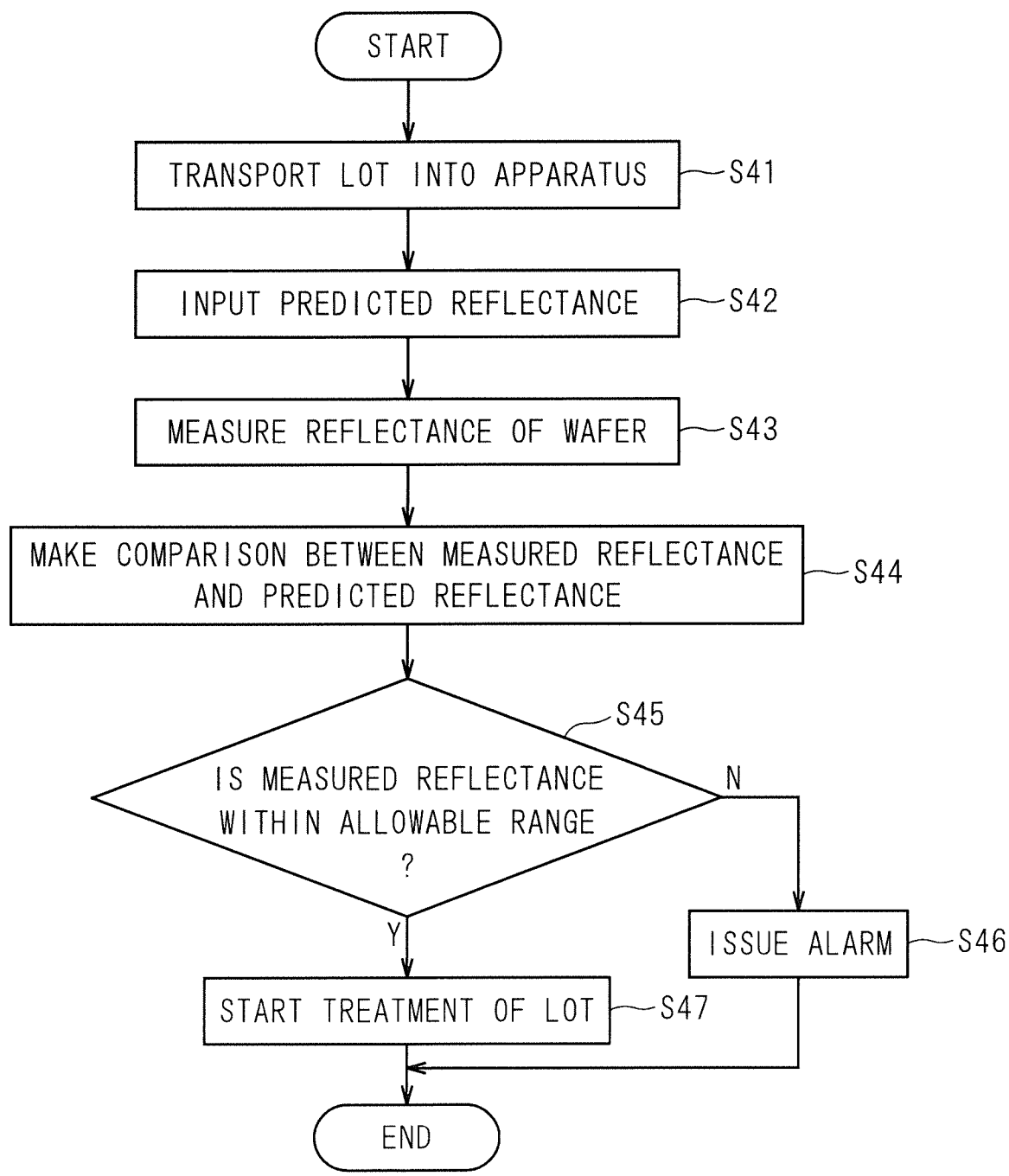

LIGHT IRRADIATION TYPE HEAT TREATMENT METHOD AND HEAT TREATMENT APPARATUS THAT CALCULATES A TEMPERATURE OF A SUBSTRATE BASED ON A TREATMENT RECIPE APPLICABLE THERETO

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature for an extremely short time, thereby achieving only the activation of the impurities without deep diffusion of the impurities.

In general, a controller controls a variety of components in an apparatus for treating a semiconductor wafer in accordance with a recipe which specifies treatment procedures and treatment conditions, whereby a desired treatment is performed. Japanese Patent Application Laid-Open No. 2009-231652 discloses that a controller controls components also in a flash lamp annealer in accordance with a recipe, whereby heat treatment is performed on a semiconductor wafer.

For a flash heating treatment of a semiconductor wafer, it is hence necessary to select and set a recipe which causes a suitable treatment to be performed. Specifically, it is necessary to set a recipe including treatment conditions which cause the temperature of a surface of a semiconductor wafer to exactly reach a target temperature at the time of flash irradiation. A conventional technique includes actually performing the flash heating treatment experimentally on a semiconductor wafer through the use of at least two types of recipes, and measuring the temperature of the surface of the semiconductor wafer, to thereby set a recipe including optimum treatment conditions.

The reflectance of a wafer surface is an important parameter not only in the flash lamp annealing but also in an annealing process which heats a semiconductor wafer by light irradiation. Even when irradiated with light of the same intensity, a semiconductor wafer having a higher reflectance is lower in attained temperature because a larger amount of light is reflected from the semiconductor wafer. Japanese Patent Application Laid-Open No. 2014-045067 discloses a technique for measuring the reflectance of a semiconductor wafer to be treated.

The aforementioned conventional recipe setting technique, however, searches for and sets optimum conditions, in a sense, by trial and error. This requires that the flash heating treatment be performed experimentally on the semiconductor wafer a large number of times using a large number of recipes in some cases. Also, this technique is highly dependent on operator's experience and skills. It is hence necessary for an unskilled operator to perform the flash heating treatment a larger number of times.

The reflectance of a semiconductor wafer is dependent on the type of film and the pattern on the wafer surface. A recipe which specifies treatment procedures and treatment conditions is set in accordance with the type of film and the pattern on the surface of a semiconductor wafer to be treated, and the annealing process is performed on the semiconductor wafer in accordance with the recipe.

Unfortunately, a semiconductor wafer on which a film of a type different from an intended one is deposited is accidentally transported into the annealer in some cases. In other cases, a semiconductor wafer on which a film of an intended type is deposited but on which an abnormal depositing process is performed is transported into the annealer. In these cases, the semiconductor wafer has a surface reflectance different from an intended one to fail to attain a desired treatment result.

SUMMARY

The present invention is intended for a method of heating a substrate by irradiating the substrate with a flash of light.

According to one aspect of the present invention, the method comprises the steps of: (a) setting a recipe specifying a treatment procedure and a treatment condition for a substrate to be treated; (b) measuring a reflectance of the substrate; (c) calculating the temperature of the substrate at the time of heating treatment, based on the recipe set in the step (a) and the reflectance measured in the step (b); and (d) displaying the temperature of the substrate calculated in the step (c).

This allows the setting of the treatment condition with reference to the predicted temperature, to thereby easily achieve the setting of the heat treatment condition.

According to another aspect of the present invention, the method comprises the steps of: (a) measuring a reflectance of a substrate to be treated; (b) extracting a recipe and a substrate temperature corresponding to the reflectance measured in the step (a) from a database in which reflectances, recipes specifying treatment procedures and treatment conditions, and substrate temperatures at the time of heating treatment are associated with each other; and (c) displaying the recipe and substrate temperature extracted in the step (b).

This allows the setting of the treatment condition based on past actual results, to thereby easily achieve the setting of the heat treatment condition.

According to still another aspect of the present invention, the method comprises the steps of: (a) measuring a reflectance of a substrate to be treated; (b) calculating a treatment condition required for the substrate to attain a target temperature at the time of heating treatment, based on the reflectance measured in the step (a); and (c) displaying the treatment condition calculated in the step (b).

This allows the setting of the treatment condition determined from the measured reflectance by a computation process, to thereby easily achieve the setting of the heat treatment condition.

According to a further aspect of the present invention, the method comprises the steps of: (a) inputting a predicted reflectance of a substrate to be treated; (b) measuring a reflectance of the substrate; (c) making a comparison between the reflectance measured in the step (b) and the predicted reflectance; and (d) issuing an alarm when the reflectance measured in the step (b) deviates from the predicted reflectance beyond a predetermined range.

This method is capable of appropriately detecting an abnormal substrate.

The present invention is also intended for a heat treatment apparatus for heating a substrate by irradiating the substrate with a flash of light.

According to one aspect of the present invention, the heat treatment apparatus comprises: a chamber for receiving a substrate to be treated therein; a flash lamp for irradiating the substrate received in the chamber with a flash of light; an input part for accepting the setting of a recipe specifying a treatment procedure and a treatment condition for the substrate; a reflectance measuring part for measuring a reflectance of the substrate; a temperature calculating part for calculating the temperature of the substrate at the time of heating treatment, based on the recipe set from the input part and the reflectance measured by the reflectance measuring part; and a display part for displaying the temperature of the substrate calculated by the temperature calculating part.

This allows the setting of the treatment condition with reference to the predicted temperature, to thereby easily achieve the setting of the heat treatment condition.

According to another aspect of the present invention, the heat treatment apparatus comprises: a chamber for receiving a substrate to be treated therein; a flash lamp for irradiating the substrate received in the chamber with a flash of light; a reflectance measuring part for measuring a reflectance of the substrate; a storage part for storing a database in which reflectances, recipes specifying treatment procedures and treatment conditions, and substrate temperatures at the time of heating treatment are associated with each other; an extracting part for extracting a recipe and a substrate temperature corresponding to the reflectance measured by the reflectance measuring part from the database; and a display part for displaying the recipe and substrate temperature extracted by the extracting part.

This allows the setting of the treatment condition based on past actual results, to thereby easily achieve the setting of the heat treatment condition.

According to still another aspect of the present invention, the heat treatment apparatus comprises: a chamber for receiving a substrate to be treated therein; a flash lamp for irradiating the substrate received in the chamber with a flash of light; a reflectance measuring part for measuring a reflectance of the substrate; a treatment condition calculating part for calculating a treatment condition required for the substrate to attain a target temperature at the time of heating treatment, based on the reflectance measured by the reflectance measuring part; and a display part for displaying the treatment condition calculated by the treatment condition calculating part.

This allows the setting of the treatment condition determined from the measured reflectance by a computation process, to thereby easily achieve the setting of the heat treatment condition.

According to a further aspect of the present invention, the heat treatment apparatus comprises: a chamber for receiving a substrate to be treated therein; a light irradiator for irradiating the substrate received in the chamber with light; an input part for accepting an input of a predicted reflectance of the substrate; a reflectance measuring part for measuring a reflectance of the substrate; a comparing part for making a comparison between the reflectance measured by the reflectance measuring part and the predicted reflectance; and an alarm issuing part for issuing an alarm when the reflectance measured by the reflectance measuring part deviates from the predicted reflectance beyond a predetermined range.

The heat treatment apparatus is capable of appropriately detecting an abnormal substrate.

It is therefore a primary object of the present invention to easily set heat treatment conditions.

It is another object of the present invention to appropriately detect an abnormal substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of the susceptor;

FIG. 7 is a plan view of a transfer mechanism;

FIG. 11 is a flow diagram showing a procedure for calculating a predicted attainable temperature of a semiconductor wafer according to a first preferred embodiment;

FIG. 12 is a view showing an example of a display screen displayed on a display part;

FIG. 15 is a block diagram showing a configuration of the controller according to a third preferred embodiment;

FIG. 17 is a diagram showing a configuration of the reflectance measuring part and the controller according to a fourth preferred embodiment;

FIG. 18 is a flow diagram showing a procedure for inspecting the semiconductor wafer, based on a reflectance according to the fourth preferred embodiment.

DESCRIPTION OF THE PREFERRED EMBODIMENTS

Preferred embodiments according to the present invention will now be described in detail with reference to the drawings.

First Preferred Embodiment

Figure 1:
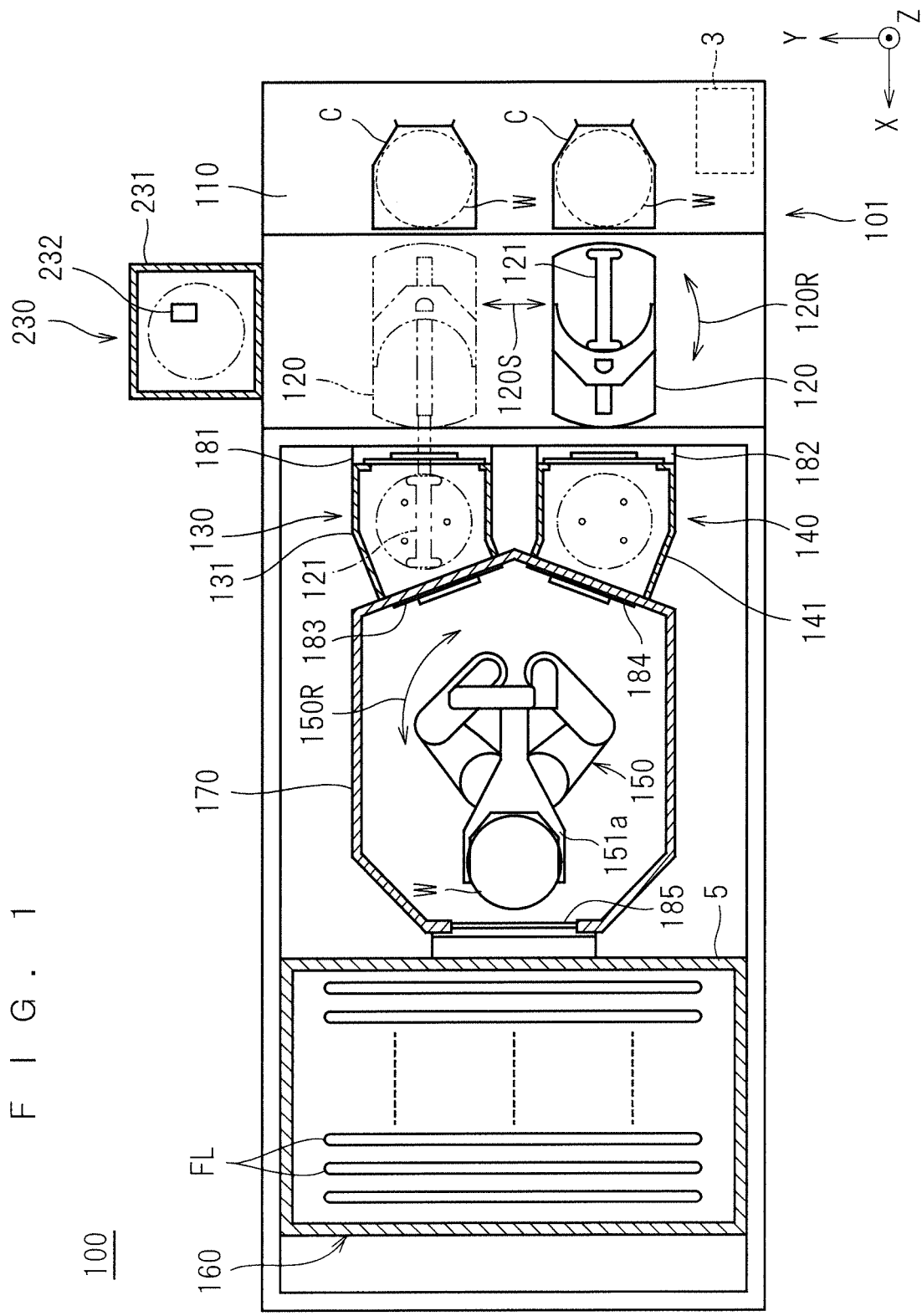
FIG. 1 is a plan view of a heat treatment apparatus according to the present invention.
Figure 2:
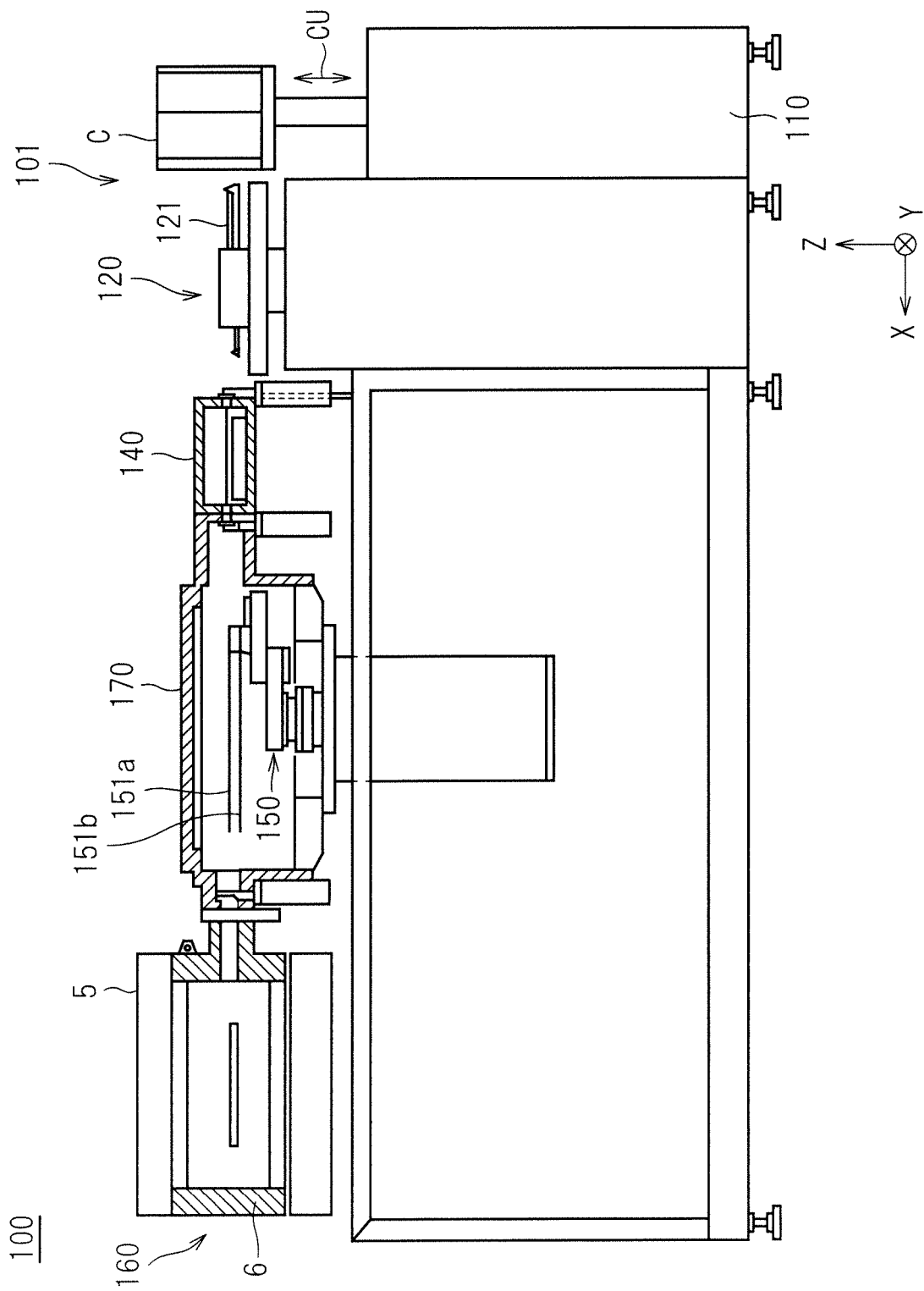
FIG. 2 is a front view of the heat treatment apparatus of FIG. 1.

First, an overall configuration of a heat treatment apparatus according to the present invention will be described. FIG. 1 is a plan view of a heat treatment apparatus 100 according to the present invention, and FIG. 2 is a front view of the heat treatment apparatus 100. The heat treatment apparatus 100 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. The semiconductor wafer W prior to the transport into the heat treatment apparatus 100 is implanted with impurities. The heat treatment apparatus 100 performs heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding. An XYZ rectangular coordinate system in which an XY plane is defined as a horizontal plane and a Z axis is defined to extend in a vertical direction is additionally shown in FIGS. 1 to 3 for purposes of clarifying the directional relationship therebetween.

As shown in FIGS. 1 and 2, the heat treatment apparatus 100 includes: an indexer part 101 for transporting untreated semiconductor wafers W from the outside into the heat treatment apparatus 100 and for transporting treated semiconductor wafers W to the outside of the heat treatment apparatus 100; an alignment part 230 for positioning an untreated semiconductor wafer W; two cooling parts 130 and 140 for cooling semiconductor wafers W subjected to the heating treatment; a heat treatment part 160 for performing flash heating treatment on a semiconductor wafer W; and a transport robot 150 for transferring a semiconductor wafer W to and from the cooling parts 130 and 140 and the heat treatment part 160. The heat treatment apparatus 100 further includes a controller 3 for controlling operating mechanisms provided in the aforementioned processing parts and the transport robot 150 to cause the flash heating treatment of the semiconductor wafer W to proceed.

The indexer part 101 includes: a load port 110 for placing thereon a plurality of (in this preferred embodiment, two) carriers (or cassettes) C arranged in juxtaposition; and a transfer robot 120 for taking an untreated semiconductor wafer W out of each of the carriers C and for storing a treated semiconductor wafer W into each of the carriers C. An unmanned transport vehicle (an AGV (automatic guided vehicle) or an OHT (overhead hoist transfer)) or the like transports a carrier C with untreated semiconductor wafers W stored therein to place the carrier C on the load port 110, and carries a carrier C with treated semiconductor wafers W stored therein away from the load port 110.

In the load port 110, the carriers C are movable upwardly and downwardly as indicated by an arrow CU in FIG. 2 so that the transfer robot 120 is able to load any semiconductor wafer W into each carrier C and unload any semiconductor wafer W from each carrier C. The carriers C may be of the following types: an SMIF (standard mechanical interface) pod and an OC (open cassette) which exposes stored semiconductor wafer W to the outside atmosphere, in addition to a FOUP (front opening unified pod) which stores semiconductor wafer W in an enclosed or sealed space.

The transfer robot 120 is slidable as indicated by an arrow 120S in FIG. 1, pivotable as indicated by an arrow 120R in FIG. 1, and movable upwardly and downwardly. Thus, the transfer robot 120 loads and unloads semiconductor wafers W into and from the two carriers C, and transfers semiconductor wafers W to and from the alignment part 230 and the two cooling parts 130 and 140. The operation of the transfer robot 120 loading and unloading the semiconductor wafers W into and from the carriers C is achieved by the sliding movement of a hand 121 of the transfer robot 120 and the upward and downward movement of the carriers C. The transfer of the semiconductor wafers W between the transfer robot 120 and the alignment part 230 or between the transfer robot 120 and the cooling parts 130 and 140 is achieved by the sliding movement of the hand 121 and the upward and downward movement of the transfer robot 120.

The alignment part 230 is provided on and connected to one side of the indexer part 101 in adjacent relation thereto along the Y axis. The alignment part 230 is a processing part for rotating a semiconductor wafer W in a horizontal plane to an orientation appropriate for flash heating. The alignment part 230 includes an alignment chamber 231 which is a housing made of an aluminum alloy, mechanisms (a rotary support part 237 and a rotary motor 238 shown in FIG. 10) provided in the alignment chamber 231 and for supporting and rotating a semiconductor wafer W in a horizontal attitude, a mechanism provided in the alignment chamber 231 and for optically detecting a notch, an orientation flat, and the like formed in a peripheral portion of a semiconductor wafer W, and the like. A reflectance measuring part 232 for measuring the reflectance of a front surface of a semiconductor wafer W supported in the alignment chamber 231 is also provided in the alignment chamber 231. The reflectance measuring part 232 irradiates the front surface of the semiconductor wafer W with light and receives light reflected from the front surface to measure the reflectance of the front surface of the semiconductor wafer W, based on the intensity of the reflected light.

The transfer robot 120 transfers a semiconductor wafer W to and from the alignment part 230. The semiconductor wafer W with the center thereof in a predetermined position is transferred from the transfer robot 120 to the alignment chamber 231. The alignment part 230 rotates the semiconductor wafer W received from the indexer part 101 about a vertical axis passing through the central portion of the semiconductor wafer W to optically detect a notch and the like, thereby adjusting the orientation of the semiconductor wafer W. Also, the reflectance measuring part 232 measures the reflectance of the front surface of the semiconductor wafer W. The semiconductor wafer W subjected to the orientation adjustment is taken out of the alignment chamber 231 by the transfer robot 120.

A transport chamber 170 for housing the transport robot 150 therein is provided as space for transport of the semiconductor wafer W by means of the transport robot 150. A treatment chamber 6 in the heat treatment part 160, a first cool chamber 131 in the cooling part 130, and a second cool chamber 141 in the cooling part 140 are connected in communication with three sides of the transport chamber 170.

The heat treatment part 160 which is a principal part of the heat treatment apparatus 100 is a substrate processing part for irradiating a preheated semiconductor wafer W with flashes of light from xenon flash lamps FL to perform flash heating treatment on the semiconductor wafer W. The configuration of the heat treatment part 160 will be described later in detail.

The two cooling parts 130 and 140 are substantially similar in configuration to each other. The cooling parts 130 and 140 include respective metal cooling plates and respective quartz plates (both not shown) placed on the upper surfaces of the cooling plates in the first and second cool chambers 131 and 141 which are housings made of an aluminum alloy. Each of the cooling plates is temperature-controlled at ordinary temperatures (approximately 23° C.) by a Peltier element or by circulation of constant-temperature wafer. The semiconductor wafer W subjected to the flash heating treatment in the heat treatment part 160 is transported into the first cool chamber 131 or the second cool chamber 141, and is then placed and cooled on a corresponding one of the quartz plates.

The first cool chamber 131 and the second cool chamber 141 provided between the indexer part 101 and the transport chamber 170 are connected to both the indexer part 101 and the transport chamber 170. Each of the first cool chamber 131 and the second cool chamber 141 has two openings for transporting the semiconductor wafer W thereinto and therefrom. One of the openings of the first cool chamber 131 which is connected to the indexer part 101 is openable and closable by a gate valve 181. The other opening of the first cool chamber 131 which is connected to the transport chamber 170 is openable and closable by a gate valve 183. In other words, the first cool chamber 131 and the indexer part 101 are connected to each other through the gate valve 181, and the first cool chamber 131 and the transport chamber 170 are connected to each other through the gate valve 183.

The gate valve 181 is opened when the semiconductor wafer W is transferred between the indexer part 101 and the first cool chamber 131. The gate valve 183 is opened when the semiconductor wafer W is transferred between the first cool chamber 131 and the transport chamber 170. When the gate valve 181 and the gate valve 183 are closed, the interior of the first cool chamber 131 is an enclosed space.

One of the two openings of the second cool chamber 141 which is connected to the indexer part 101 is openable and closable by a gate valve 182. The other opening of the second cool chamber 141 which is connected to the transport chamber 170 is openable and closable by a gate valve 184. In other words, the second cool chamber 141 and the indexer part 101 are connected to each other through the gate valve 182, and the second cool chamber 141 and the transport chamber 170 are connected to each other through the gate valve 184.

The gate valve 182 is opened when the semiconductor wafer W is transferred between the indexer part 101 and the second cool chamber 141. The gate valve 184 is opened when the semiconductor wafer W is transferred between the second cool chamber 141 and the transport chamber 170. When the gate valve 182 and the gate valve 184 are closed, the interior of the second cool chamber 141 is an enclosed space.

The cooling parts 130 and 140 further include respective gas supply mechanisms for supplying clean nitrogen gas to the first and second cool chambers 131 and 141 and respective exhaust mechanisms for exhausting atmospheres from the first and second cool chambers 131 and 141. The gas supply mechanisms and the exhaust mechanisms may be capable of changing the flow rates thereof in two levels.

The transport robot 150 provided in the transport chamber 170 is pivotable about a vertical axis as indicated by an arrow 150R. The transport robot 150 includes two linkage mechanisms comprised of a plurality of arm segments. Transport hands 151a and 151b each for holding a semiconductor wafer W are provided at respective distal ends of the two linkage mechanisms. These transport hands 151a and 151b are vertically spaced a predetermined distance apart from each other, and are independently linearly slidable in the same horizontal direction by the respective linkage mechanisms. The transport robot 150 moves a base provided with the two linkage mechanisms upwardly and downwardly to thereby move the two transport hands 151a and 151b spaced the predetermined distance apart from each other upwardly and downwardly.

When the transport robot 150 transfers (loads and unloads) a semiconductor wafer W to and from the first cool chamber 131, the second cool chamber 141, or the treatment chamber 6 in the heat treatment part 160 as a transfer target, both of the transport hands 151a and 151b pivot into opposed relation to the transfer target, and move upwardly or downwardly after (or during) the pivotal movement, so that one of the transport hands 151a and 151b reaches a vertical position at which the semiconductor wafer W is to be transferred to and from the transfer target. Then, the transport robot 150 causes the transport hand 151a (or 151b) to linearly slide in a horizontal direction, thereby transferring the semiconductor wafer W to and from the transfer target.

The transfer of a semiconductor wafer W between the transport robot 150 and the transfer robot 120 is performed through the cooling parts 130 and 140. That is, the first cool chamber 131 in the cooling part 130 and the second cool chamber 141 in the cooling part 140 function also as paths for transferring a semiconductor wafer W between the transport robot 150 and the transfer robot 120. Specifically, one of the transport robot 150 and the transfer robot 120 transfers a semiconductor wafer W to the first cool chamber 131 or the second cool chamber 141, and the other of the transport robot 150 and the transfer robot 120 receives the semiconductor wafer W, whereby the transfer of the semiconductor wafer W is performed. The transport robot 150 and the transfer robot 120 constitute a transport mechanism for transporting a semiconductor wafer W from the carriers C to the heat treatment part 160.

As mentioned above, the gate valves 181 and 182 are provided between the indexer part 101 and the first and second cool chambers 131 and 141, respectively. The gate valves 183 and 184 are provided between the transport chamber 170 and the first and second cool chambers 131 and 141, respectively. A gate valve 185 is further provided between the transport chamber 170 and the treatment chamber 6 of the heat treatment part 160. These gate valves 181 to 185 are opened and closed, as appropriate, when the semiconductor wafer W is transported in the heat treatment apparatus 100. Nitrogen gas is supplied from a gas supply part to the transport chamber 170 and the alignment chamber 231, and an exhaust part exhausts atmospheres from the transport chamber 170 and the alignment chamber 231 (both not shown).

Figure 3:
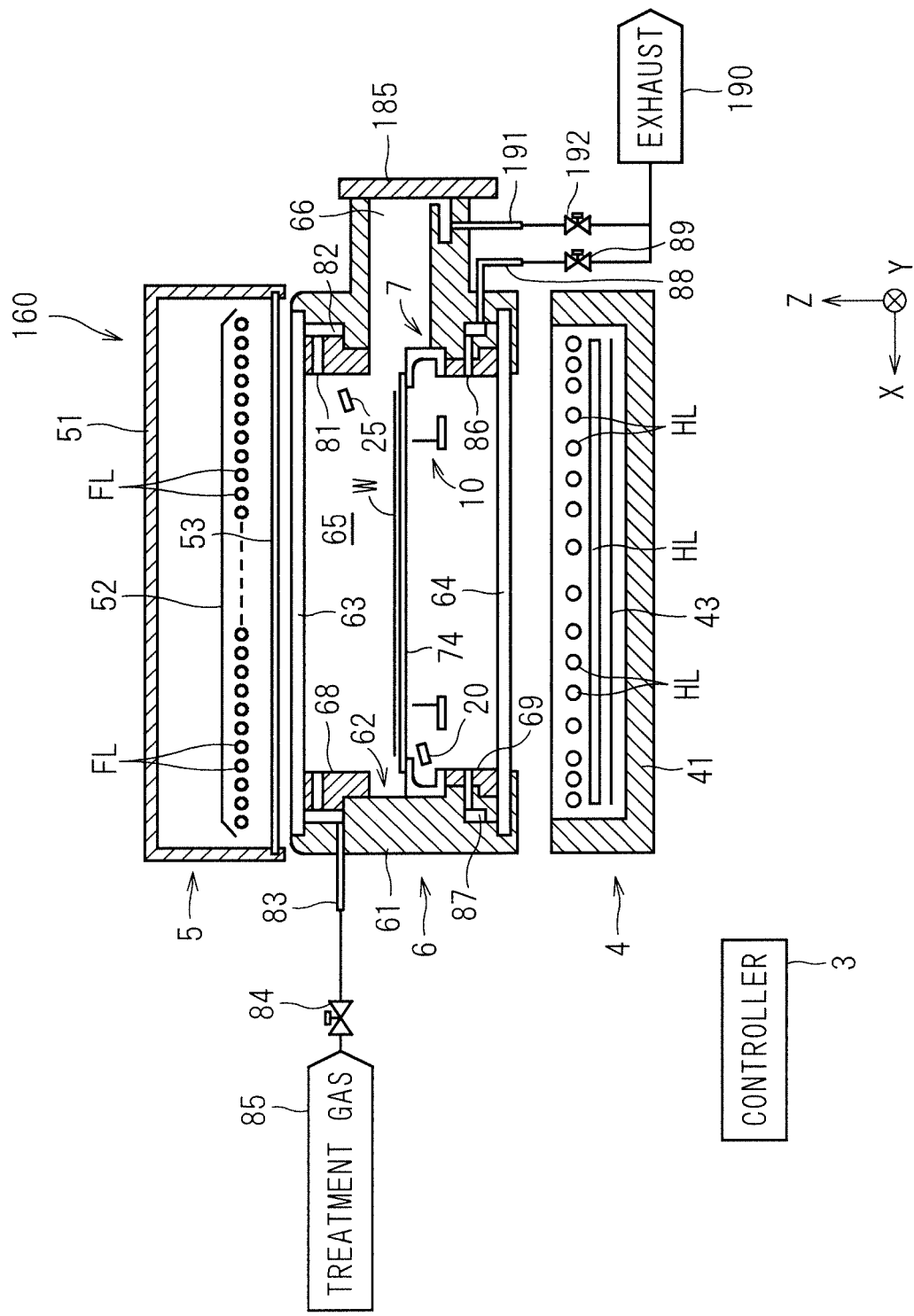
FIG. 3 is a longitudinal sectional view showing a configuration of a heat treatment part.

Next, the configuration of the heat treatment part 160 will be described. FIG. 3 is a longitudinal sectional view showing the configuration of the heat treatment part 160. The heat treatment part 160 includes the treatment chamber 6 for receiving a semiconductor wafer W therein to perform heating treatment on the semiconductor wafer W, a flash lamp house 5 including the plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment part 160 further includes a holder 7 provided inside the treatment chamber 6 and for holding a semiconductor wafer W in a horizontal attitude, and a transfer mechanism 10 provided inside the treatment chamber 6 and for transferring a semiconductor wafer W between the holder 7 and the transport robot 150.

The treatment chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the treatment chamber 6 is a disk-shaped member made of quartz, and serves as a quartz window that transmits flashes of light emitted from the flash lamps FL therethrough into the treatment chamber 6. The lower chamber window 64 forming the floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (although nitrogen is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and may be in the form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 4:
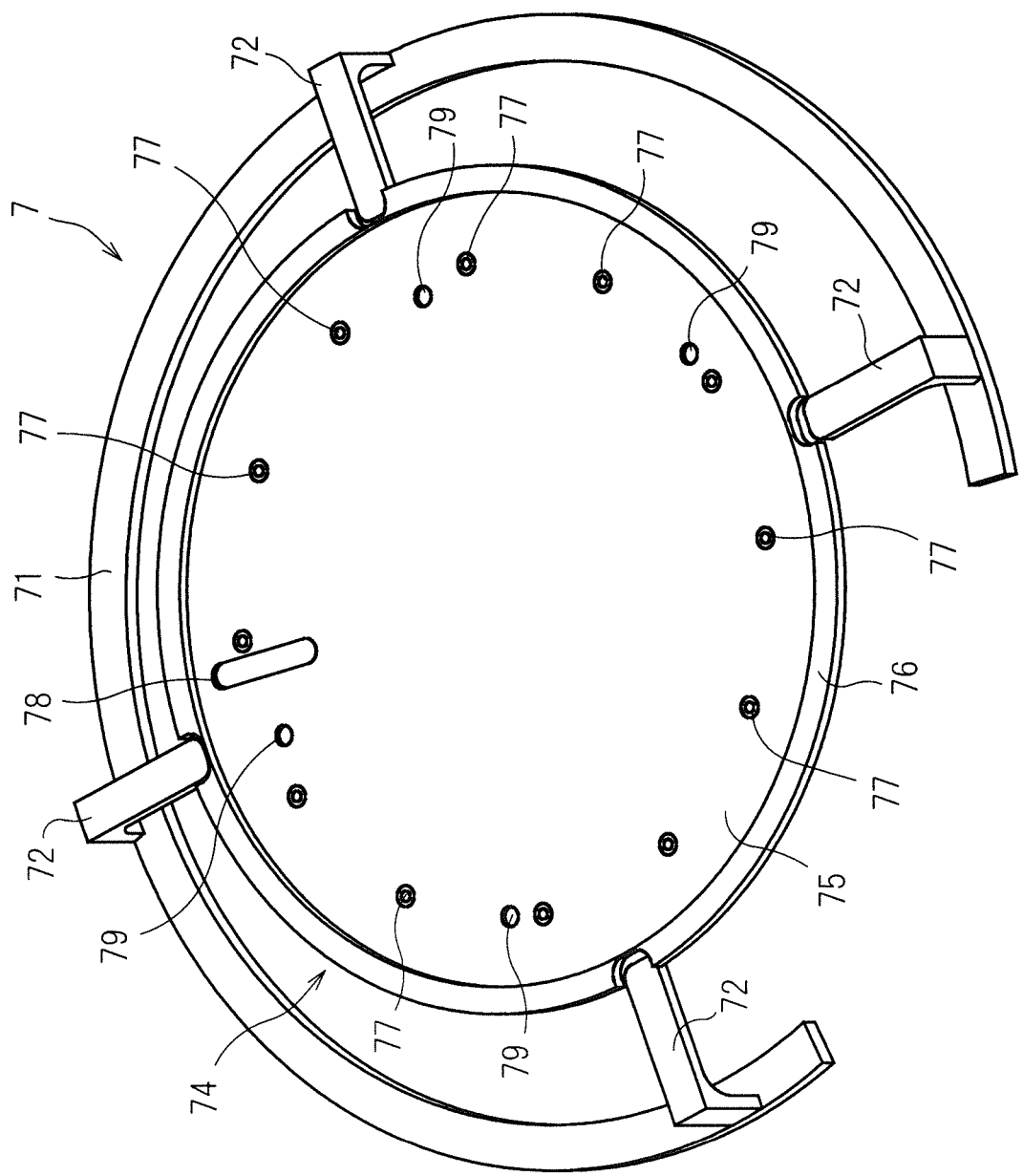
FIG. 4 is a perspective view showing the entire external appearance of a holder.

FIG. 4 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 5:
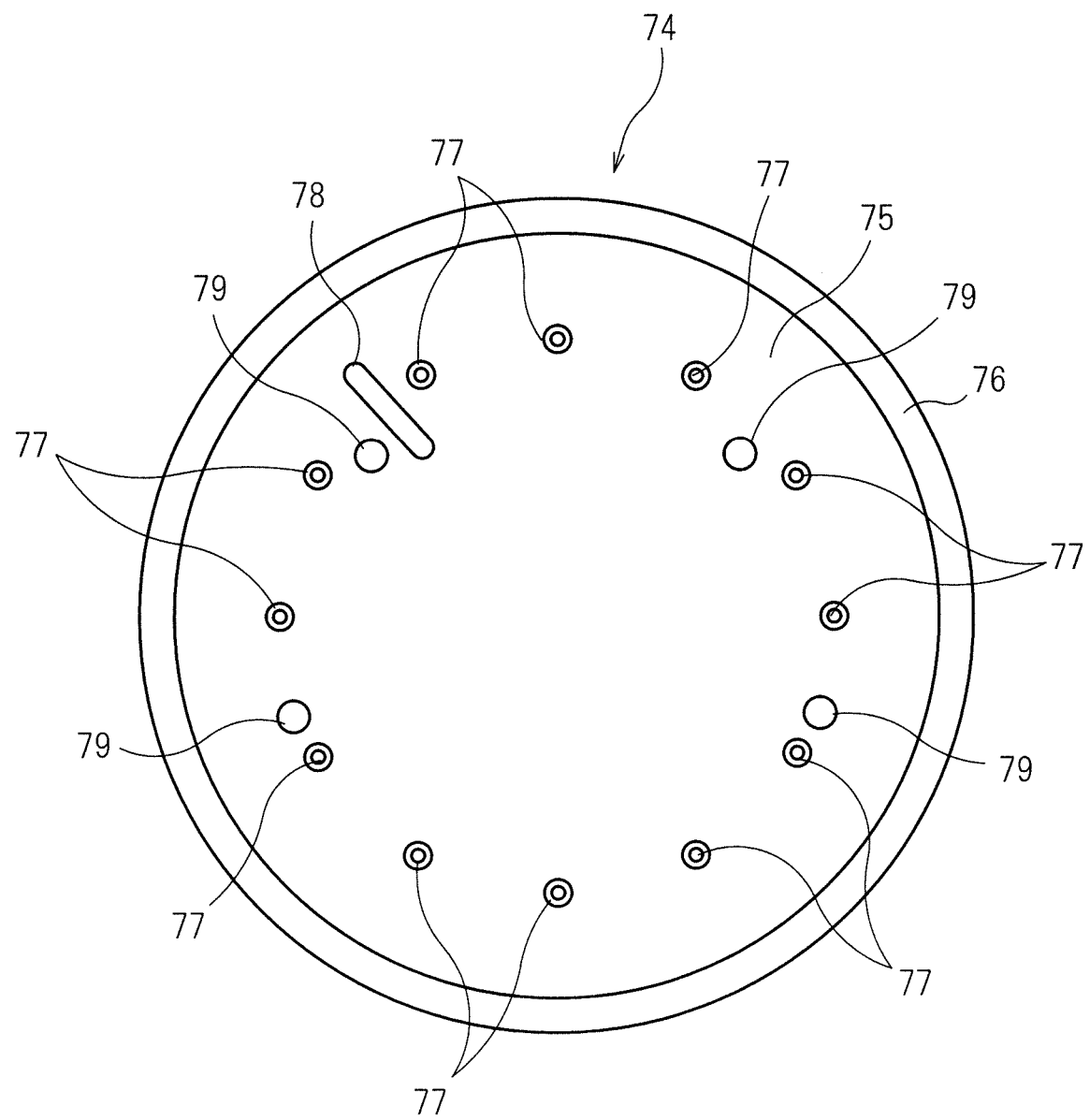
FIG. 5 is a plan view of a susceptor.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the treatment chamber 6. With the holder 7 mounted to the treatment chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 4 and 5, an opening 78 is provided in the holding plate 75 of the susceptor 74 so as to extend vertically through the holding plate 75 of the susceptor 74. The opening 78 is provided for a lower radiation thermometer 20 (with reference to FIG. 3) to receive radiation (infrared radiation) emitted from the lower surface of the semiconductor wafer W held by the susceptor 74. Specifically, the lower radiation thermometer 20 receives the radiation emitted from the lower surface of the semiconductor wafer W held by the susceptor 74 through the opening 78 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 8:
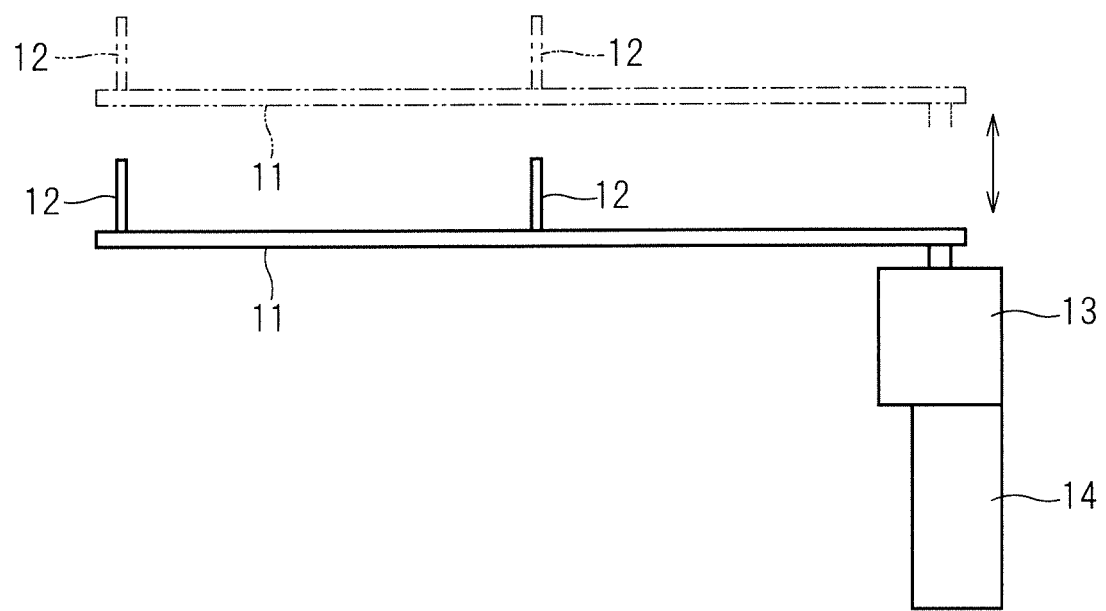
FIG. 8 is a side view of the transfer mechanism.

FIG. 7 is a plan view of the transfer mechanism 10. FIG. 8 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dash-double-dot lines in FIG. 7) in which the transfer arms 11 do not overlap the semiconductor wafer W held by the holder 7 as seen in plan view. The transfer operation position is under the susceptor 74, and the retracted position is outside the susceptor 74. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 4 and 5) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

Referring again to FIG. 3, the treatment chamber 6 is provided with two radiation thermometers: an upper radiation thermometer 25 and the lower radiation thermometer 20. As mentioned above, the lower radiation thermometer 20 receives the infrared radiation emitted from the lower surface of the semiconductor wafer W through the opening 78 of the susceptor 74 to measure the temperature of the semiconductor wafer W, based on the intensity of the infrared radiation. On the other hand, the upper radiation thermometer 25 receives the infrared radiation emitted from the upper surface of the semiconductor wafer W held by the susceptor 74 to measure the temperature of the upper surface of the semiconductor wafer W, based on the intensity of the infrared radiation. Preferably, a high-speed radiation thermometer is used as the upper radiation thermometer 25 so as to be able to keep up with abrupt temperature changes in the upper surface of the semiconductor wafer W during the flash irradiation.

The flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51 of the flash lamp house 5. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

Figure 9:
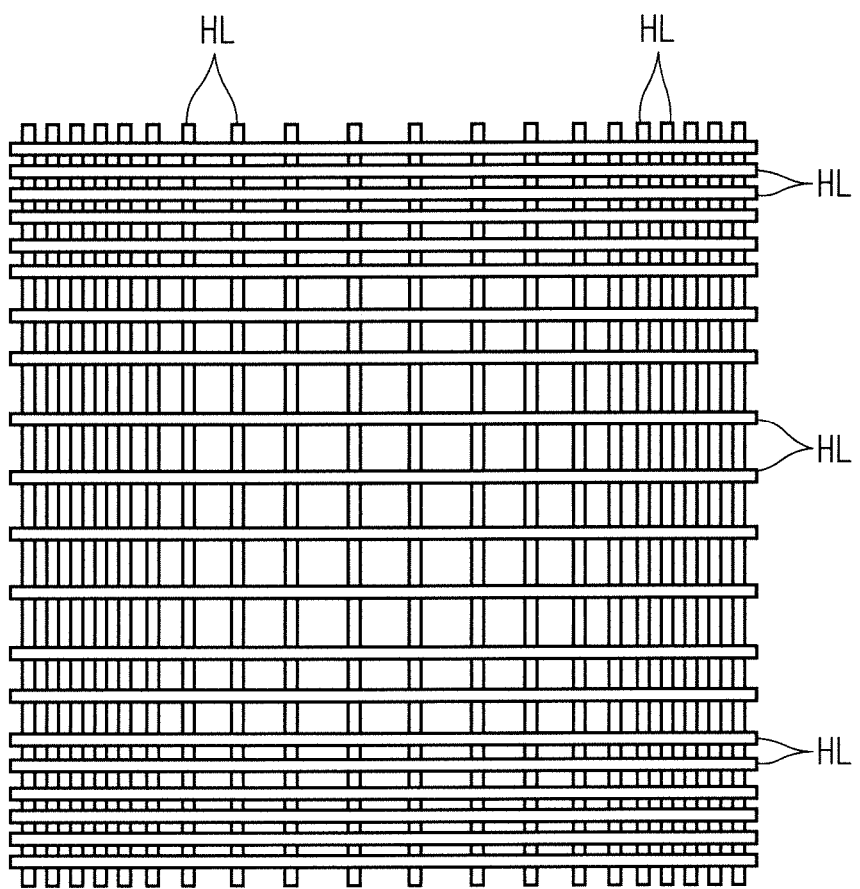
FIG. 9 is a plan view showing an arrangement of halogen lamps.

FIG. 9 is a plan view showing an arrangement of the multiple halogen lamps HL. In the present preferred embodiment, 20 halogen lamps HL are arranged in each of two tiers, i.e. upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each of the halogen lamps HL arranged in the upper tier and the longitudinal direction of each of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

The heat treatment part 160 further includes, in addition to the aforementioned components, various cooling structures to prevent an excessive temperature rise in the halogen lamp house 4, the flash lamp house 5, and the treatment chamber 6 because of the heat energy generated from the halogen lamps HL and the flash lamps FL during the heat treatment of a semiconductor wafer W. As an example, a water cooling tube (not shown) is provided in the walls of the treatment chamber 6. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

Figure 10:
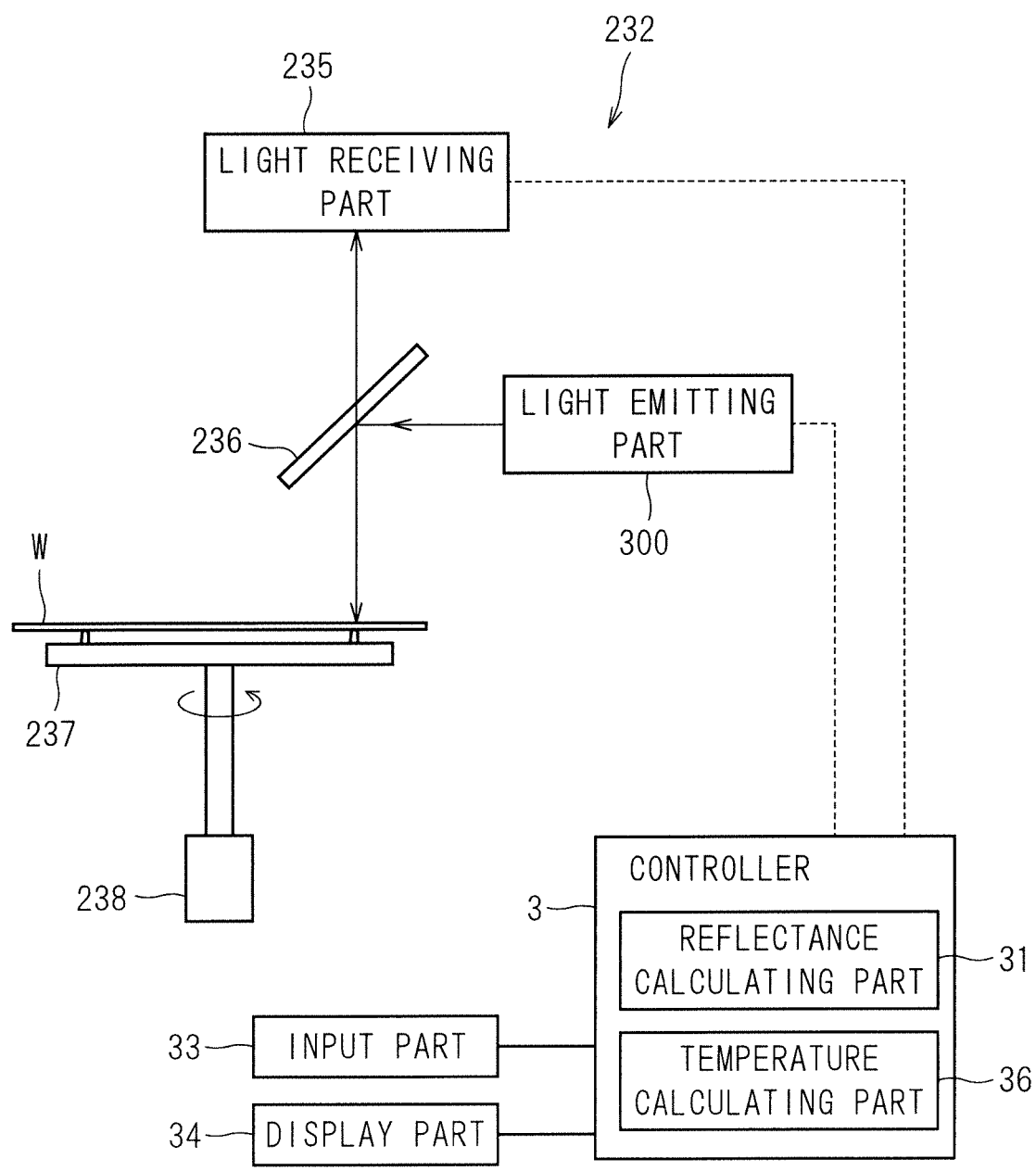
FIG. 10 is a diagram showing a configuration of a reflectance measuring part and a controller.

FIG. 10 is a diagram showing a configuration of the reflectance measuring part 232 provided in the alignment part 230 and the controller 3. The reflectance measuring part 232 includes a light emitting part 300, a light receiving part 235, a half mirror 236, and a reflectance calculating part 31. The rotary support part 237 for supporting and rotating a semiconductor wafer W and the rotary motor 238 for rotatably driving the rotary support part 237 are provided in the alignment chamber 231 of the alignment part 230. The rotary motor 238 rotates the rotary support part 237 supporting the semiconductor wafer W, whereby the orientation of the semiconductor wafer W is adjusted.

The light emitting part 300 includes a light source such as a halogen light source or an LED light source, and emits light for reflectance measurement. The light receiving part 235 includes a light receiving element for converting the intensity of received light into an electric signal. Light emitted from the light emitting part 300 is reflected by the half mirror 236, and is applied perpendicularly to the upper surface of the semiconductor wafer W supported by the rotary support part 237. The applied light from the light emitting part 300 is reflected from the upper surface of the semiconductor wafer W. The reflected light is transmitted through the half mirror 236, and is received by the light receiving part 235. The reflectance calculating part 31 of the controller 3 calculates the reflectance of the upper surface of the semiconductor wafer W, based on the intensity of the reflected light received by the light receiving part 235. The light emitting part 300 may include a plurality of light sources different in wavelength range of light to be applied or may be configured to apply light to a plurality of locations on the upper surface of the semiconductor wafer W. The provision of a plurality of light sources different in wavelength range in the light emitting part 300 allows the measurement of the reflectance of the semiconductor wafer W over a wide wavelength range. The application of light to a plurality of locations on the upper surface of the semiconductor wafer W allows a reduction in local pattern dependence.

The controller 3 controls the aforementioned various operating mechanisms provided in the heat treatment apparatus 100. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 100 proceed. The reflectance calculating part 31 and a temperature calculating part 36 are functional processing parts implemented by the CPU of the controller 3 executing a predetermined processing program. The details on the processing in the temperature calculating part 36 will be further described later. The controller 3 is shown in the indexer part 101 in FIG. 1. The present invention, however, is not limited to this. The controller 3 may be disposed in any position in the heat treatment apparatus 100.

The controller 3 is connected to a display part 34 and an input part 33. The controller 3 causes a variety of pieces of information to appear on the display part 34. An operator of the heat treatment apparatus 100 may input various commands and parameters from the input part 33 while viewing the information appearing on the display part 34. A keyboard and a mouse, for example, may be used as the input part 33. A liquid crystal display, for example, may be used as the display part 34. In the present preferred embodiment, a liquid crystal touch panel provided on an outer wall of the heat treatment apparatus 100 is used to function as both the display part 34 and the input part 33.

Next, a treatment operation in the heat treatment apparatus 100 according to the present invention will be described. A typical treatment operation for an ordinary semiconductor wafer (product wafer) W that becomes a product will be described herein. A semiconductor wafer W to be treated herein is a semiconductor substrate doped with impurities (ions) by an ion implantation process. The impurities are activated by the heat treatment apparatus 100 performing the process of heating (annealing) the semiconductor wafer W by means of flash irradiation.

First, while being stored in a carrier C, untreated semiconductor wafers W implanted with impurities are placed on the load port 110 of the indexer part 101. The transfer robot 120 takes the untreated semiconductor wafers W one by one out of the carrier C to transport each of the untreated semiconductor wafers W into the alignment chamber 231 of the alignment part 230. In the alignment chamber 231, a semiconductor wafer W supported by the rotary support part 237 is rotated in a horizontal plane about a vertical axis passing through the central portion of the semiconductor wafer W, and a notch or the like is optically detected, whereby the orientation of the semiconductor wafer W is adjusted.

Next, the transfer robot 120 of the indexer part 101 takes the orientation-adjusted semiconductor wafer W out of the alignment chamber 231 to transport the semiconductor wafer W into the first cool chamber 131 of the cooling part 130 or the second cool chamber 141 of the cooling part 140. The untreated semiconductor wafer W transported into the first cool chamber 131 or the second cool chamber 141 is transported to the transport chamber 170 by the transport robot 150. The first cool chamber 131 and the second cool chamber 141 function as the paths for transferring the semiconductor wafer W when the untreated semiconductor wafer W is transferred from the indexer part 101 via the first cool chamber 131 or the second cool chamber 141 to the transport chamber 170.

After taking out the semiconductor wafer W, the transport robot 150 pivots so as to face toward the heat treatment part 160. Subsequently, the gate valve 185 opens the space between the treatment chamber 6 and the transport chamber 170, and the transport robot 150 transports the untreated semiconductor wafer W into the treatment chamber 6. At this time, if a preceding semiconductor wafer W subjected to the heating treatment is present in the treatment chamber 6, the untreated semiconductor wafer W is transported into the treatment chamber 6 after one of the transport hands 151$a$ and 151$b$ takes out the semiconductor wafer W subjected to the heating treatment. In this manner, the semiconductor wafers W are interchanged. Thereafter, the gate valve 185 closes the space between the treatment chamber 6 and the transport chamber 170.

The semiconductor wafer W transported into the treatment chamber 6 is preheated by the halogen lamps HL, and is thereafter subjected to the flash heating treatment by flash irradiation from the flash lamps FL. This flash heating treatment activates the impurities implanted in the semiconductor wafer W.

After the completion of the flash heating treatment, the gate valve 185 opens the space between the treatment chamber 6 and the transport chamber 170 again, and the transport robot 150 transports the semiconductor wafer W subjected to the flash heating treatment from the treatment chamber 6 to the transport chamber 170. After taking out the semiconductor wafer W, the transport robot 150 pivots from the treatment chamber 6 so as to face toward the first cool chamber 131 or the second cool chamber 141. The gate valve 185 closes the space between the treatment chamber 6 and the transport chamber 170.

Thereafter, the transport robot 150 transports the semiconductor wafer W subjected to the heating treatment into the first cool chamber 131 of the cooling part 130 or the second cool chamber 141 of the cooling part 140. At this time, the semiconductor wafer W that has passed through the first cool chamber 131 before the heating treatment is also transported into the first cool chamber 131 after the heating treatment, and the semiconductor wafer W that has passed through the second cool chamber 141 before the heating treatment is also transported into the second cool chamber 141 after the heating treatment. In the first cool chamber 131 or the second cool chamber 141, the semiconductor wafer W subjected to the flash heating treatment is cooled. The semiconductor wafer W is cooled to near ordinary temperatures in the first cool chamber 131 or the second cool chamber 141 because the temperature of the entire semiconductor wafer W is relatively high when the semiconductor wafer W is transported out of the treatment chamber 6 of the heat treatment part 160.

After a lapse of a predetermined cooling time period, the transfer robot 120 transports the cooled semiconductor wafer W out of the first cool chamber 131 or the second cool chamber 141, and returns the cooled semiconductor wafer W back to the carrier C. After a predetermined number of treated semiconductor wafers W are stored in the carrier C, the carrier C is transported from the load port 110 of the indexer part 101 to the outside.

The description on the heating treatment in the heat treatment part 160 will be continued. Prior to the transport of the semiconductor wafer W into the treatment chamber 6, the valve 84 is opened for supply of gas, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65.

The gas within the treatment chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment part 160. The amount of nitrogen gas supplied into the heat treatment space 65 is changed as appropriate in accordance with process steps.

Subsequently, the gate valve 185 is opened to open the transport opening 66. The transport robot 150 transports a semiconductor wafer W to be treated through the transport opening 66 into the heat treatment space 65 of the treatment chamber 6. The transport robot 150 moves the transport hand 151$a$ (or the transport hand 151$b$) holding the untreated semiconductor wafer W forward to a position lying immediately over the holder 7, and stops the transport hand 151$a$ (or the transport hand 151$b$) thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 causes the transport hand 151$a$ to move out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7, the 40 halogen lamps HL turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the lower radiation thermometer 20 when the halogen lamps HL perform the preheating. Specifically, the lower radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20. The preheating temperature T1 shall be on the order of 600° to 800° C. (in the present preferred embodiment, 700° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL irradiate the front surface of the semiconductor wafer W with a flash of light at the point in time when a predetermined time period has elapsed since the temperature of the semiconductor wafer W reached the preheating temperature T1. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the flash heating achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport hand 151b (or the transport hand 151a) of the transport robot 150 transports the treated semiconductor wafer W placed on the lift pins 12 to the outside. The transport robot 150 moves the transport hand 151b forward to a position lying immediately under the semiconductor wafer W thrust upwardly by the lift pins 12, and stops the transport hand 151b thereat. Then, the pair of transfer arms 11 of the transfer mechanism 10 moves downwardly, whereby the semiconductor wafer W subjected to the flash heating is transferred to and placed on the transport hand 151b. Thereafter, the transport robot 150 causes the transport hand 151b to move out of the treatment chamber 6, thereby transporting the treated semiconductor wafer W to the outside.

Next, a technique for predicting the treatment temperature T2 which the front surface of a semiconductor wafer W attains at the time of the flash heating in advance will be described. FIG. 11 is a flow diagram showing a procedure for calculating a predicted attainable temperature of a semiconductor wafer W according to the first preferred embodiment. First, a lot is transported into the heat treatment apparatus 100 (Step S11). The term "lot" refers to a group of semiconductor wafers W becoming subject to the same treatment under the same conditions. Specifically, multiple (in the present preferred embodiment, 25) semiconductor wafers W in a lot are placed on the load port 110 of the indexer part 101 while being stored in a carrier C.

Next, a recipe is set for each of the semiconductor wafers W stored in the carrier C (Step S12). The term "recipe" refers to a list of specifications about treatment procedures and treatment conditions of heat treatment of each semiconductor wafer W. The controller 3 controls the mechanisms in the heat treatment apparatus 100 in accordance with the recipe, whereby the preheating treatment and the flash heating treatment as mentioned above are performed on each semiconductor wafer W. Recipes of multiple types are previously created and stored on the storage part or the like of the controller 3. The operator of the heat treatment apparatus 100 selects an appropriate recipe via the touch panel functioning as both the display part 34 and the input part 33, and individually sets the selected recipe for each of the semiconductor wafers W stored in the carrier C. Typically, one carrier C contains a plurality of semiconductor wafers W becoming subject to the same treatment under the same conditions. In such a case, one common recipe may be set for the plurality of semiconductor wafers W stored in the carrier C. Alternatively, treatment procedure recipes of multiple types in which only the treatment procedures are specified and treatment condition recipes of multiple types in which only the treatment conditions are specified may be previously separately created, stored on the storage part or the like of the controller 3, and used in combination during the setting of the recipes.

After the recipes are set for the respective semiconductor wafers W, the transfer robot 120 takes the semiconductor wafers W one by one out of the carrier C to transport each of the semiconductor wafers W into the alignment chamber 231 of the alignment part 230. In the alignment chamber 231, a semiconductor wafer W is supported by the rotary support part 237. Then, the reflectance measuring part 232 measures the reflectance of the front surface of the semiconductor wafer W supported by the rotary support part 237 (Step S13). Specifically, light emitted from the light emitting part 300 of the reflectance measuring part 232 is reflected by the half mirror 236, and is applied to the front surface of the semiconductor wafer W at an incidence angle of 0°. The applied light from the light emitting part 300 is reflected from the front surface of the semiconductor wafer W. The reflected light is transmitted through the half mirror 236, and is received by the light receiving part 235. Thus, the intensity of the light reflected from the semiconductor wafer W is acquired.

The intensity of light reflected from a bare silicon wafer that is neither patterned nor implanted with ions is previously measured by the reflectance measuring part 232 using the same technique as described above, and is stored on the storage part of the controller 3. Using the intensity of light reflected from the bare wafer as a reference, the reflectance calculating part 31 divides the intensity of the light reflected from the semiconductor wafer W and received by the light receiving part 235 by the intensity of the light reflected from the bare wafer to calculate the reflectance of the front surface of the semiconductor wafer W. That is, the relative reflectance of the semiconductor wafer W with reference to the bare wafer is calculated in the present preferred embodiment. The calculated reflectance of the semiconductor wafer W is stored on the storage part of the controller 3.

After the reflectance measurement is completed, the transfer robot 120 takes the semiconductor wafer W subjected to the measurement out of the alignment chamber 231, and returns the semiconductor wafer W to the carrier C on the load port 110. Specifically, an exclusive transport mode for the measurement of the reflectance of a semiconductor wafer W is prepared in the heat treatment apparatus 100. In the transport mode, the semiconductor wafer W transported out of the alignment chamber 231 is not transported to the treatment chamber 6 but is immediately returned to the original carrier C.

The reflectance measurement in Step S13 is performed sequentially on all of the semiconductor wafers W stored in the carrier C. That is, the semiconductor wafers W stored in the carrier C are sequentially transported to the alignment chamber 231, subjected to the reflectance measurement, and thereafter returned to the original carrier C.

After the reflectance measurement of all of the semiconductor wafers W stored in the carrier C is completed, the temperature calculating part 36 of the controller 3 calculates the predicted attainable temperature of each of the semiconductor wafers W (Step S14). The recipes in which the treatment conditions are specified are set for all of the semiconductor wafers W stored in the carrier C. Examples of the treatment conditions in the recipes include the discharge voltage and the irradiation time period (pulse width) of the flash lamps FL at the time of the flash irradiation. More specifically, the discharge voltage of the flash lamps FL is defined by the charging voltage to the capacitors for supplying electric power to the flash lamps FL. The irradiation time period of the flash lamps FL is defined, for example, by the pulse waveform applied to the gate of an IGBT (insulated-gate bipolar transistor) connected to each of the flash lamps FL.

The reflectances (relative reflectances) of all of the semiconductor wafers W stored in the carrier C are measured. That is, the reflectance as an optical property of the wafers and the discharge voltage and the irradiation time period as optical properties of the flash lamps FL are acquired as parameters for all of the semiconductor wafers W stored in the carrier C. Based on these parameters, the temperature calculating part 36 calculates the predicted attainable temperature of the front surface of each of the semiconductor wafers W stored in the carrier C at the time of the flash irradiation. Specifically, an attained front surface temperature measured when the bare wafer is treated under the treatment conditions specified in the set recipe is stored. The temperature calculating part 36 calculates the predicted attainable temperature of the front surface of each of the semiconductor wafers W, based on the relative reflectance of each of the semiconductor wafers W with reference to the bare wafer and the attained front surface temperature of the bare wafer. When the relative reflectance of a semiconductor wafer W is less than 1, the predicted attainable temperature of the front surface of the semiconductor wafer W is higher than the attained front surface temperature of the bare wafer. The predicted attainable temperature may be a temperature profile indicating changes in temperature of the front surface of the semiconductor wafer W for a fixed time period or be a maximum attained temperature of the front surface of the semiconductor wafer W.

Subsequently, the controller 3 causes the predicted attainable temperature of each of the semiconductor wafers W calculated by the temperature calculating part 36 to appear on the display part 34 (Step S15). FIG. 12 is a view showing an example of a display screen displayed on the display part 34. As shown in FIG. 12, the measured reflectances ("Reflect"), the set recipes ("Recipe"), and the calculated predicted attainable temperatures ("Peak Temperature") for all of the 25 semiconductor wafers W stored in the carrier C are displayed together with the carrier ID (identification data) of the carrier C on the display screen.

The display screen of the display part 34 allows the operator of the heat treatment apparatus 100 to grasp the predicted attainable temperatures of the respective semiconductor wafers W. The operator corrects the treatment conditions in the recipes or sets the recipes again, based on the displayed predicted attainable temperatures. For example, when the predicted attainable temperature of a semiconductor wafer W is higher than a desired target temperature, the operator decreases the discharge voltage of the flash lamps FL or shortens the irradiation time period thereof so as to lower the attained temperature of the semiconductor wafer W.

In the first preferred embodiment, the predicted attainable temperature of a semiconductor wafer W at the time of the flash heating treatment is calculated based on the set recipe and the measured reflectance of the semiconductor wafer W, and the calculated predicted attainable temperature is displayed. The operator of the heat treatment apparatus 100 uses the displayed predicted attainable temperature, in a sense, as a beachhead to set the treatment conditions. This allows the operator to set the heat treatment conditions easily as compared with the technique of finding the optimum conditions by trial and error.

Second Preferred Embodiment

Next, a second preferred embodiment according to the present invention will be described. The second preferred embodiment is generally similar to the first preferred embodiment in configuration of the heat treatment apparatus 100 and in procedure for treatment of the semiconductor wafer W. The second preferred embodiment is different from the first preferred embodiment in the technique of determining the predicted attainable temperature.

Figure 13:
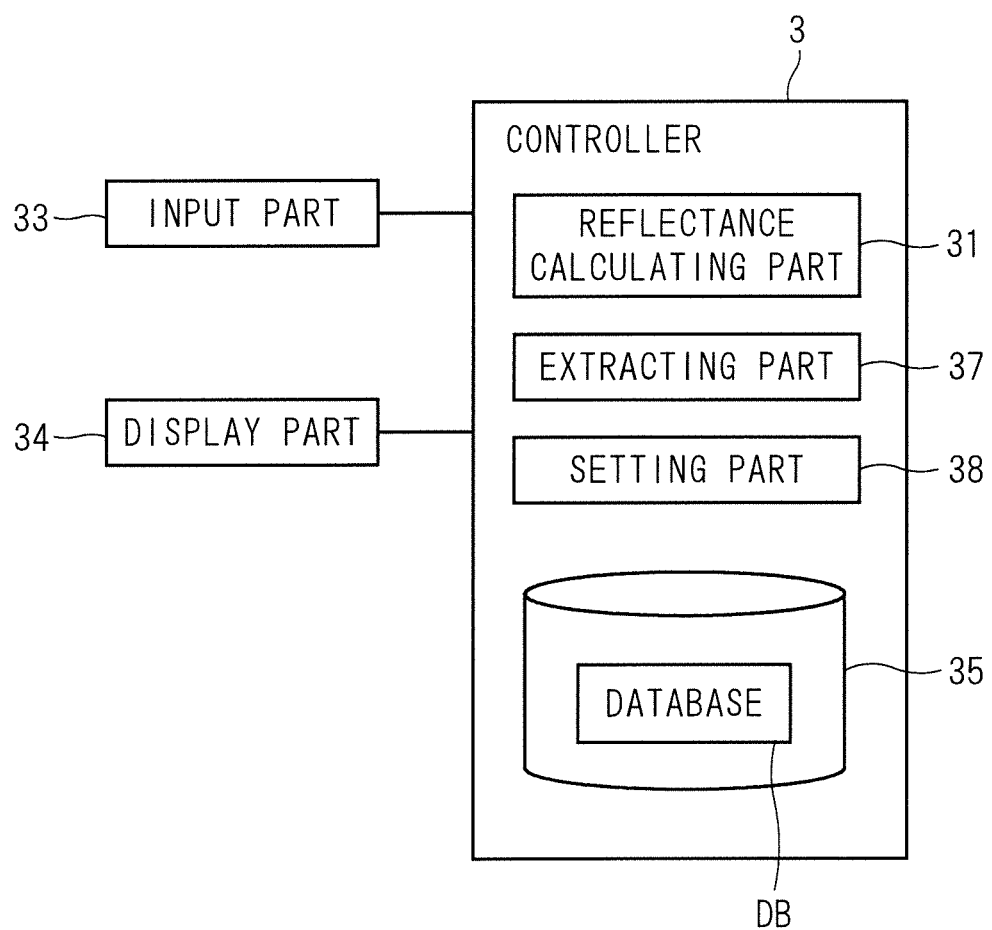
FIG. 13 is a block diagram showing a configuration of the controller according to a second preferred embodiment.

FIG. 13 is a block diagram showing a configuration of the controller 3 according to the second preferred embodiment. Like reference numerals and characters are used in FIG. 13 to designate components identical with those of the first preferred embodiment (FIG. 10). The controller 3 according to the second preferred embodiment includes an extracting part 37 and a setting part 38 in addition to the reflectance calculating part 31. The extracting part 37 and the setting part 38 are also functional processing parts implemented by the CPU of the controller 3 executing a predetermined processing program. The details on the processing in the extracting part 37 and the setting part 38 will be further described later.

In the second preferred embodiment, a database DB is stored on a magnetic disk 35 that is a storage part of the controller 3. The reflectances, recipes, and temperatures of the semiconductor wafers W in the past flash heating treatment are registered in association with each other in the database DB. The reflectances of the semiconductor wafers W registered in the database DB are reflectances measured by the reflectance measuring part 232 in the alignment chamber 231. The recipes registered in the database DB are recipes set for the respective semiconductor wafers W. The temperatures registered in the database DB are front surface temperatures of the respective semiconductor wafers W measured with the upper radiation thermometer 25 at the time of the flash heating treatment. Each of the temperatures registered in the database DB may be a temperature profile indicating changes in temperature of the front surface of a semiconductor wafer W for a fixed time period or be a maximum attained temperature of the front surface of the semiconductor wafer W.

Figure 14:
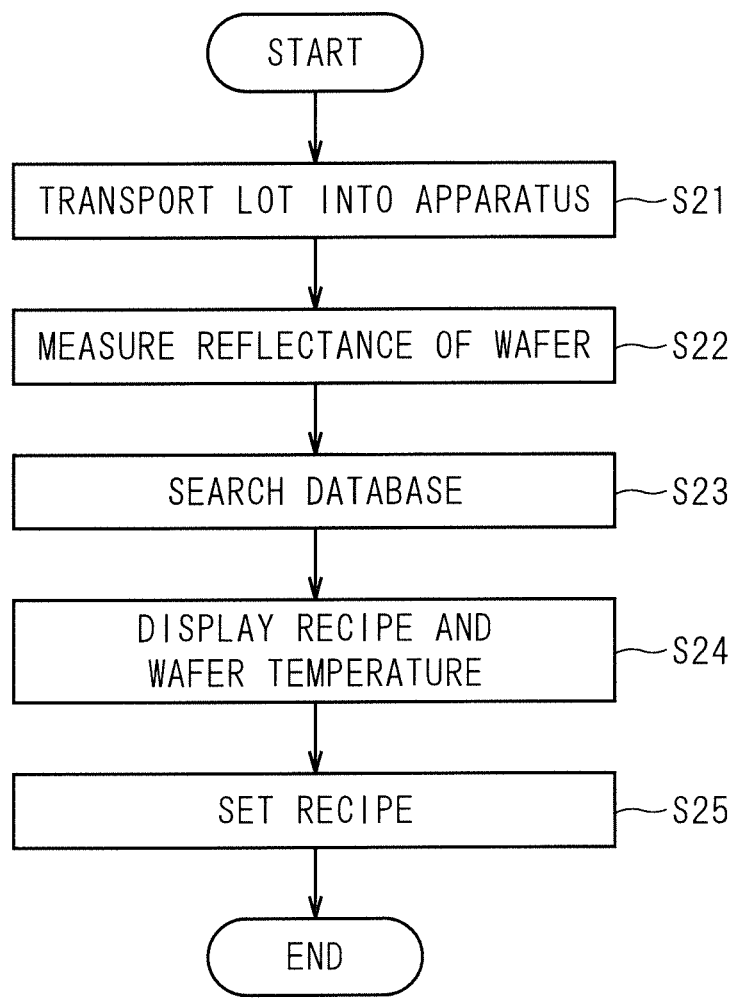
FIG. 14 is a flow diagram showing a procedure for determining the predicted attainable temperature of the semiconductor wafer according to the second preferred embodiment.

FIG. 14 is a flow diagram showing a procedure for determining the predicted attainable temperature of a semiconductor wafer W according to the second preferred embodiment. First, a lot is transported into the heat treatment apparatus 100 (Step S21), as in the first preferred embodiment. Specifically, multiple (in the present preferred embodiment, 25) semiconductor wafers W in a lot are placed on the load port 110 of the indexer part 101 while being stored in a carrier C.

After the carrier C is placed on the load port 110, the reflectance of the front surface of each of the semiconductor wafers W is measured in the second preferred embodiment (Step S22). Specifically, the transfer robot 120 takes the semiconductor wafers W one by one out of the carrier C to transport each of the semiconductor wafers W into the alignment chamber 231 of the alignment part 230. In the alignment chamber 231, a semiconductor wafer W is supported by the rotary support part 237. Then, the reflectance measuring part 232 measures the reflectance of the front surface of the semiconductor wafer W supported by the rotary support part 237, as in the first preferred embodiment.

After the reflectance measurement is completed, the transfer robot 120 takes the semiconductor wafer W subjected to the measurement out of the alignment chamber 231, and returns the semiconductor wafer W to the carrier C on the load port 110. The reflectance measurement in Step S22 is performed sequentially on all of the semiconductor wafers W stored in the carrier C. That is, the semiconductor wafers W stored in the carrier C are sequentially transported to the alignment chamber 231, subjected to the reflectance measurement, and thereafter returned to the original carrier C.

Next, the extracting part 37 of the controller 3 searches the database DB to extract the recipe and temperature of a semiconductor wafer W which are associated with a reflectance equal to or approximate to the reflectance of the semiconductor wafer W measured in Step S22 (Step S23). Subsequently, the controller 3 causes the recipe and temperature of the semiconductor wafer W which are extracted by the extracting part 37 to appear on the display part 34 (Step S24).

Actual results in the past flash heating treatment are registered in the database DB. The recipe and the temperature which are extracted by the extracting part 37 are based on the actual results of the flash heating treatment performed in the past on wafers similar in reflectance to a semiconductor wafer W to be treated. Thus, the operator of the heat treatment apparatus 100 views the information displayed on the display part 34 to thereby grasp an approximate temperature to be attained at the time of the heating treatment by setting a given recipe for the semiconductor wafer W to be treated. The operator sets an appropriate recipe for the semiconductor wafer W to be treated which is stored in the carrier C, based on the displayed recipe and temperature, and corrects the treatment conditions specified in the recipe, as required (Step S25). That is, the operator selects a recipe which causes the semiconductor wafer W to be treated to attain a desired target temperature, and sets the discharge voltage of the flash lamps FL and the flash irradiation time period.

The recipe setting in Step S25 may be performed automatically by the setting part 38 of the controller 3. As an example, when the operator inputs a desired target temperature from the input part 33, the setting part 38 may select a recipe which provides a temperature approximate to the target temperature based on the aforementioned search result to set the recipe for the semiconductor wafer W to be treated. Further, the setting part 38 may slightly correct the treatment conditions in the recipe so as to provide a temperature more approximate to the target temperature. That is, the setting part 38 may slightly correct the discharge voltage of the flash lamps FL and the flash irradiation time period which are specified in the recipe.

The heat treatment apparatus 100 performs the heat treatment on the semiconductor wafer W in accordance with the recipe set in this manner to thereby heat the semiconductor wafer W to the aforementioned target temperature.

In the second preferred embodiment, the past actual results for a wafer similar in reflectance to the semiconductor wafer W to be treated are extracted and displayed based on the database DB in which the actual results of the flash heating treatment are registered. The second preferred embodiment is capable of setting the treatment conditions of the semiconductor wafer W to be treated based on such past actual results to thereby set the heat treatment conditions easily as compared with the technique of finding the optimum conditions by trial and error.

Third Preferred Embodiment

Next, a third preferred embodiment according to the present invention will be described. The third preferred embodiment is generally similar to the first preferred embodiment in configuration of the heat treatment apparatus 100 and in procedure for treatment of the semiconductor wafer W. The third preferred embodiment is different from the first and second preferred embodiments in the technique of setting the treatment conditions.

FIG. 15 is a block diagram showing a configuration of the controller 3 according to the third preferred embodiment. Like reference numerals and characters are used in FIG. 15 to designate components identical with those of the first preferred embodiment (FIG. 10) and the second preferred embodiment (FIG. 13). The controller 3 according to the third preferred embodiment includes a condition calculating part 39 and the setting part 38 in addition to the reflectance calculating part 31. The condition calculating part 39 and the setting part 38 are also functional processing parts implemented by the CPU of the controller 3 executing a predetermined processing program. The details on the processing in the condition calculating part 39 and the setting part 38 will be further described later.

Figure 16:
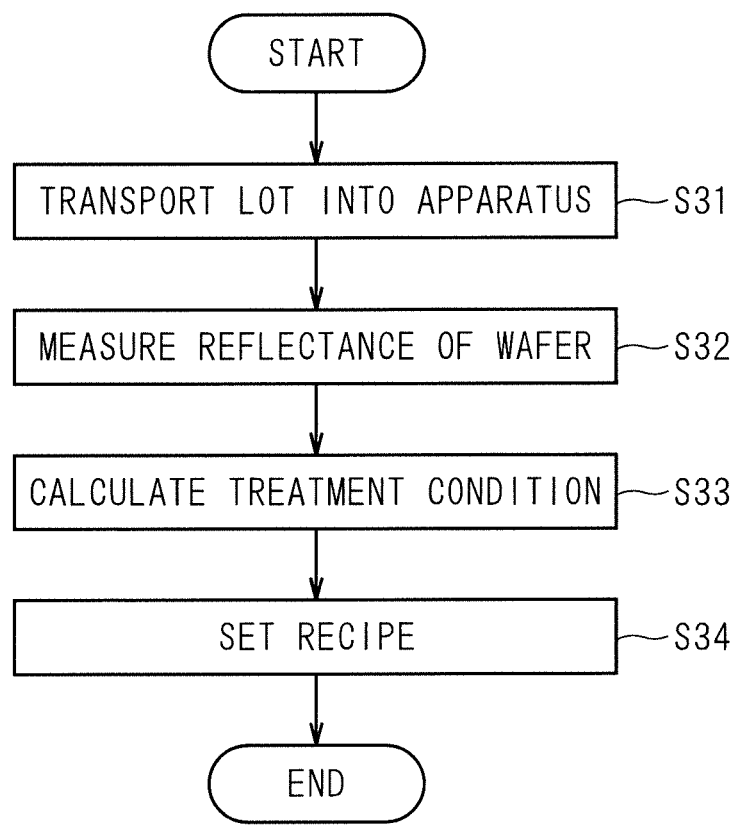
FIG. 16 is a flow diagram showing a procedure for setting treatment conditions of the semiconductor wafer according to the third preferred embodiment.

FIG. 16 is a flow diagram showing a procedure for setting the treatment conditions of a semiconductor wafer W according to the third preferred embodiment. First, a lot is transported into the heat treatment apparatus 100 (Step S31), as in the first preferred embodiment. Specifically, multiple (in the present preferred embodiment, 25) semiconductor wafers W in a lot are placed on the load port 110 of the indexer part 101 while being stored in a carrier C.

After the carrier C is placed on the load port 110, the reflectance of the front surface of each of the semiconductor wafers W is measured in the third preferred embodiment (Step S32). Specifically, the transfer robot 120 takes the semiconductor wafers W one by one out of the carrier C to transport each of the semiconductor wafers W into the alignment chamber 231 of the alignment part 230. In the alignment chamber 231, a semiconductor wafer W is supported by the rotary support part 237. Then, the reflectance measuring part 232 measures the reflectance of the front surface of the semiconductor wafer W supported by the rotary support part 237, as in the first preferred embodiment.

After the reflectance measurement is completed, the transfer robot 120 takes the semiconductor wafer W subjected to the measurement out of the alignment chamber 231, and returns the semiconductor wafer W to the carrier C on the load port 110. The reflectance measurement in Step S32 is performed sequentially on all of the semiconductor wafers W stored in the carrier C. That is, the semiconductor wafers W stored in the carrier C are sequentially transported to the alignment chamber 231, subjected to the reflectance measurement, and thereafter returned to the original carrier C.

Next, the condition calculating part 39 of the controller 3 calculates the treatment conditions for the heating of the semiconductor wafer W to be treated to a desired target temperature, based on the reflectance of the semiconductor wafer W measured in Step S32 (Step S33). The condition calculating part 39 applies a known computation model to the measured reflectance that is an optical property of the semiconductor wafer W to calculate the discharge voltage of the flash lamps FL, the flash irradiation time period, and the like which are necessary to obtain the desired target temperature as the treatment conditions. The calculated treatment conditions are displayed on the display part 34.

Next, the setting part 38 of the controller 3 creates a recipe which specifies the treatment conditions calculated in Step S33 to set the recipe for the semiconductor wafer W to be treated. The heat treatment apparatus 100 performs the heat treatment on the semiconductor wafer W in accordance with the recipe set in this manner to thereby heat the semiconductor wafer W to the aforementioned target temperature. Alternatively, the operator of the heat treatment apparatus 100 may create the recipe to set the recipe for the semiconductor wafer W to be treated in accordance with the information displayed on the display part 34.

In the third preferred embodiment, the treatment conditions for the semiconductor wafer W to be treated to attain the desired target temperature are calculated from the measured reflectance of the semiconductor wafer W, and the recipe which specifies the treatment conditions is created and set for the semiconductor wafer W. The third preferred embodiment is capable of setting the treatment conditions of the semiconductor wafer W which are determined from the measured reflectance by the computation processes to thereby set the heat treatment conditions easily as compared with the technique of finding the optimum conditions by trial and error.

Fourth Preferred Embodiment

Next, a fourth preferred embodiment according to the present invention will be described. The fourth preferred embodiment is generally similar to the first preferred embodiment in configuration of the heat treatment apparatus 100 and in procedure for treatment of the semiconductor wafer W.

FIG. 17 is a block diagram showing a configuration of the reflectance measuring part 232 and the controller 3 according to the fourth preferred embodiment. Like reference numerals and characters are used in FIG. 17 to designate components identical with those of the first preferred embodiment (FIG. 10). The reflectance calculating part 31, a comparing part 335, and an alarm issuing part 336 are functional processing parts implemented by the CPU of the controller 3 executing a predetermined processing program. The details on the processing in the comparing part 335 and the alarm issuing part 336 will be further described later.

FIG. 18 is a flow diagram showing a procedure for a method of inspecting a semiconductor wafer W based on a reflectance according to the fourth preferred embodiment. First, a lot is transported into the heat treatment apparatus 100 (Step S41). The term "lot" refers to a group of semiconductor wafers W becoming subject to the same treatment under the same conditions. Specifically, multiple (in the present preferred embodiment, 25) semiconductor wafers W in a lot are placed on the load port 110 of the indexer part 101 while being stored in a carrier C.

Figure 19:
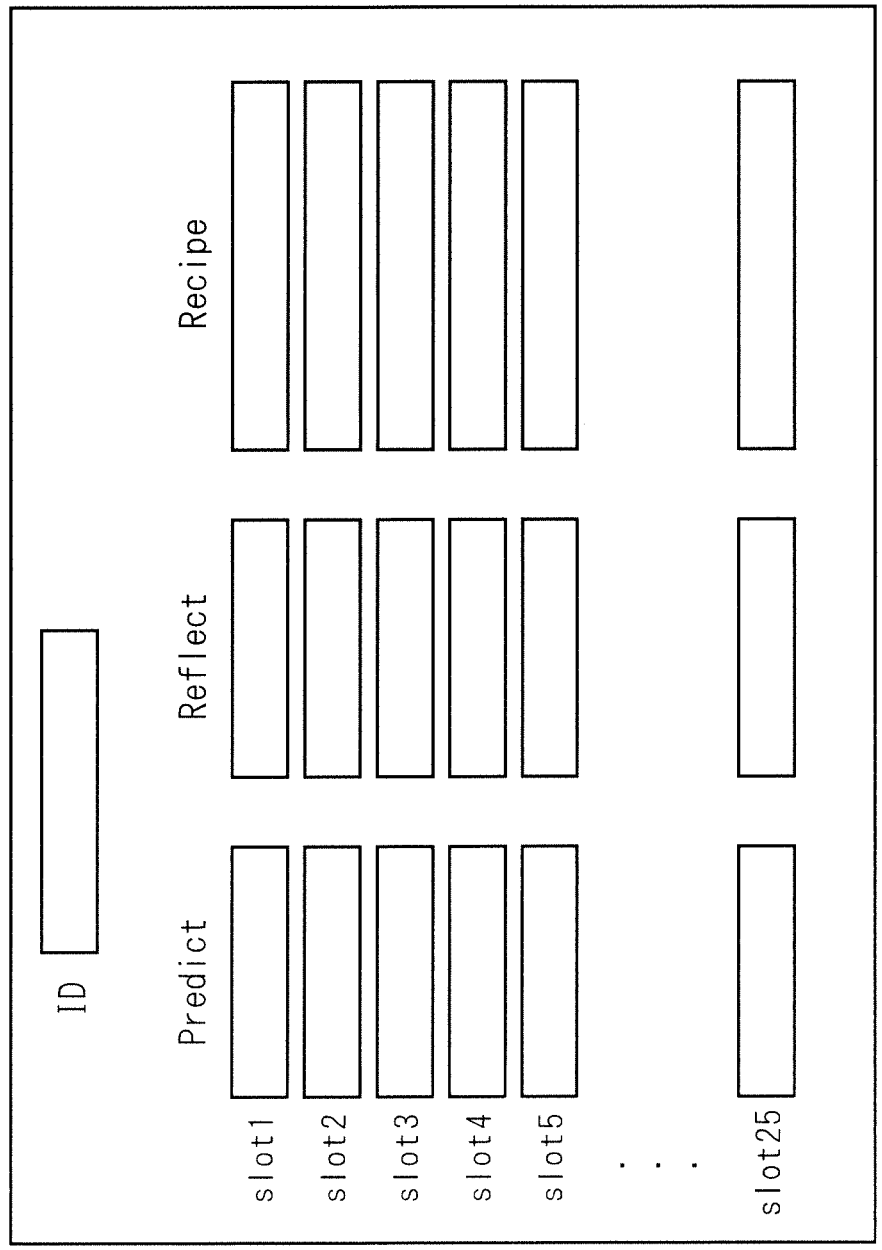
FIG. 19 is a view showing an example of the display screen displayed on the display part according to the fourth preferred embodiment.

After the carrier C is placed on the load port 110, a screen as shown in FIG. 19 appears on the display part 34. As shown in FIG. 19, input boxes for predicted reflectances ("Predict"), display boxes for measured reflectances ("Reflect"), and display boxes for recipes ("Recipe") are displayed together with the carrier ID (identification data) of the carrier C on the display screen.

The operator of the heat treatment apparatus 100 inputs a predicted reflectance into each of the predicted reflectance input boxes via the touch panel functioning as both the display part 34 and the input part 33 (Step S42). The films or patterns formed on the semiconductor wafers W stored in the carrier C and transported into the heat treatment apparatus 100 are already found, and the reflectances dependent on the types of films and the like are known. Thus, the operator inputs a reflectance dependent on the type of film formed on each of the semiconductor wafers W to be transported into the heat treatment apparatus 100 as the predicted reflectance. The inputted predicted reflectance appears in each of the predicted reflectance input boxes shown in FIG. 19.

Next, the reflectance of each of the semiconductor wafers W stored in the carrier C is measured (Step S43). Specifically, the transfer robot 120 takes the semiconductor wafers W one by one out of the carrier C to transport each of the semiconductor wafers W into the alignment chamber 231 of the alignment part 230. In the alignment chamber 231, a semiconductor wafer W is supported by the rotary support part 237 (FIG. 17). Light emitted from the light emitting part 300 of the reflectance measuring part 232 is reflected by the half mirror 236, and is applied to the front surface of the semiconductor wafer W at an incidence angle of 0°. The applied light from the light emitting part 300 is reflected from the front surface of the semiconductor wafer W. The reflected light is transmitted through the half mirror 236, and is received by the light receiving part 235, which in turn measures the intensity of the reflected light. Thus, the intensity of the light reflected from the semiconductor wafer W is acquired.

The intensity of light reflected from a bare silicon wafer that is neither patterned nor implanted with ions is previously measured by the reflectance measuring part 232 using the same technique as described above, and is stored on the storage part of the controller 3. Using the intensity of light reflected from the bare wafer as a reference, the reflectance calculating part 31 divides the intensity of the light reflected from the semiconductor wafer W and received by the light receiving part 235 by the intensity of the light reflected from the bare wafer to calculate the reflectance of the front surface of the semiconductor wafer W. That is, the relative reflectance of the semiconductor wafer W with reference to the bare wafer is calculated in the fourth preferred embodiment. The reflectance of the semiconductor wafer W calculated in this manner by the reflectance measuring part 232 is stored on the storage part of the controller 3, and is also displayed in each of the measured reflectance display boxes shown in FIG. 19.

After the reflectance measurement is completed, the transfer robot 120 takes the semiconductor wafer W subjected to the measurement out of the alignment chamber 231, and returns the semiconductor wafer W to the carrier C on the load port 110. For the normal treatment of the semiconductor wafer W, the semiconductor wafer W taken out of the alignment chamber 231 is transported via the first cool chamber 131 or the second cool chamber 141 to the treatment chamber 6. Instead, the semiconductor wafer W taken out of the alignment chamber 231 is directly returned to the original carrier C in the sequence of FIG. 18. In this manner, an exclusive transport mode for the measurement of the reflectance of a semiconductor wafer W is prepared in the heat treatment apparatus 100 of the fourth preferred embodiment. In the transport mode, the semiconductor wafer W taken out of the carrier C is transported into the alignment chamber 231 and subjected to the reflectance measurement, and thereafter the semiconductor wafer W transported out of the alignment chamber 231 is directly returned to the original carrier C. In this exclusive transport mode, the semiconductor wafer W is not transported to the treatment chamber 6. Thus, the reflectance measurement of the semiconductor wafer W is made in a short time.

The reflectance measurement in Step S43 is performed sequentially on all of the semiconductor wafers W stored in the carrier C. That is, the semiconductor wafers W stored in the carrier C are sequentially transported to the alignment chamber 231, subjected to the reflectance measurement, and thereafter returned to the original carrier C. The measured reflectances of the respective semiconductor wafers W are displaced sequentially on the display part 34.

After the reflectance measurement of all of the semiconductor wafers W stored in the carrier C is completed, the comparing part 335 of the controller 3 makes a comparison between the predicted reflectance inputted in Step S42 and the measured reflectance obtained in Step S43 (Step S44). Specifically, an allowable range of the predicted reflectance (e.g., ±3% from the predicted reflectance) is previously stored as an apparatus parameter on the storage part of the controller 3. The operator of the heat treatment apparatus 100 may change the allowable range, as appropriate, to any value.

The comparing part 335 judges whether the measured reflectance of each of the semiconductor wafers W falls within the allowable range of the predicted reflectance or not (Step S45). If the measured reflectance of a semiconductor wafer W does not fall within the allowable range of the predicted reflectance, that is, the measured reflectance deviates from the predicted reflectance beyond a predetermined range, the procedure proceeds from Step S45 to Step S46, in which the alarm issuing part 336 issues an alarm. For example, the alarm issuing part 336 indicates on the display part 34 that the measured reflectance of the semiconductor wafer W deviates from the predicted reflectance. Alternatively, the alarm issuing part 336 may causes a light or the like to turn on or blink so as to enable the operator to easily perceive the alarm. Further, the alarm issuing part 336 may display an alarm as well as generating an audible alarm.

On the other hand, if the measured reflectance of each semiconductor wafer W falls within the allowable range of the predicted reflectance, the procedure proceeds from Step S45 to Step S47, in which the treatment of the semiconductor wafers W stored in the carrier C is started. Each of the semiconductor wafers W is treated in the aforementioned procedure in accordance with the recipe set in FIG. 19.

In the fourth preferred embodiment, the comparison is made between the measured reflectance of each semiconductor wafer W and the predicted reflectance thereof. If the measured reflectance falls outside the allowable range of the predicted reflectance, an alarm is issued. Examples of the case in which the measured reflectance falls outside the allowable range of the predicted reflectance are such that a semiconductor wafer W stored in the carrier C and transported into the heat treatment apparatus 100 is not normal, e.g. the semiconductor wafer W is coated with a film of an unintended type, and such that the semiconductor wafer W is coated with a film of an intended type but of an abnormal thickness. The fourth preferred embodiment, in which an alarm is issued if the measured reflectance falls outside the allowable range of the predicted reflectance, is capable of appropriately detecting an abnormal semiconductor wafer W to prevent an erroneous treatment of such an abnormal semiconductor wafer W.

<Modifications>

While the preferred embodiments according to the present invention have been described hereinabove, various modifications of the present invention in addition to those described above may be made without departing from the scope and spirit of the invention. For example, the condition calculating part 39 of the controller 3 calculates the treatment conditions in the third preferred embodiment. Instead, a computer separately provided outside the heat treatment apparatus 100 may be used to calculate the treatment conditions from the reflectance of each semiconductor wafer W. The controller 3 is basically a control computer for controlling the components of the heat treatment apparatus 100. It is hence preferable that an exclusive computer is used to calculate the treatment conditions when complicated computation processes are performed using various parameters.

In the fourth preferred embodiment, the predicted reflectances of all of the semiconductor wafers W stored in the carrier C are individually inputted. The present invention, however, is not limited to this. Typically, one carrier C contains a plurality of semiconductor wafers W becoming subject to the same treatment under the same conditions. In such a case, one predicted reflectance common to the plurality of semiconductor wafers W stored in the carrier C may be inputted.

The process of making the judgment by comparing the measured reflectance with the predicted reflectance in the fourth preferred embodiment need not be performed on all of the semiconductor wafers W stored in the carrier C, but may be performed on only some of the semiconductor wafers W. In this case, a sampling inspection is performed on some of the semiconductor wafers W.

In the aforementioned preferred embodiments, the reflectance measuring part 232 is provided in the alignment chamber 231. The present invention, however, is not limited to this. The reflectance measuring part 232 may be provided in any position (e.g., in the first cool chamber 131 or the second cool chamber 141) lying on the transport path of the semiconductor wafer W.

Although the 30 flash lamps FL are provided in the flash lamp house 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen lamp house 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

Moreover, a substrate to be treated by the heat treatment apparatus 100 is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with a flash of light during a heating treatment, said method comprising the steps of:
   (a) setting a recipe specifying a treatment procedure and a treatment condition for a substrate to be treated;
   (b) measuring a reflectance of said substrate;
   (c) calculating a predicted temperature of said substrate at a time of the heating treatment, based on the recipe set in said step (a) and said reflectance measured in said step (b); and
   (d) displaying the temperature of said substrate calculated in said step (c).

2. A method of heating a substrate by irradiating the substrate with a flash of light during a heating treatment, said method comprising the steps of:
   (a) measuring a reflectance of a substrate to be treated;
   (b) extracting a recipe and a substrate temperature corresponding to the reflectance measured in said step (a) from a database in which reflectances, recipes specifying treatment procedures and treatment conditions, and substrate temperatures at a time of the heating treatment are associated with each other; and
   (c) displaying the recipe and a substrate temperature extracted in said step (b).

3. The method according to claim 2, further comprising the step of
   (d) setting a given treatment condition for said substrate to be treated, based on a given recipe and a given substrate temperature extracted in said step (b).

4. A method of heating a substrate by irradiating the substrate with a flash of light during a heating treatment, said method comprising the steps of:
   (a) measuring a reflectance of a substrate to be treated;
   (b) calculating a treatment condition required for said substrate to attain a target temperature at a time of the heating treatment, based on the reflectance measured in said step (a); and (c) displaying the treatment condition calculated in said step (b), wherein said treatment condition is a discharge voltage of a flash lamp irradiating a flash of light, or an irradiation time period of a flash of light.

5. The method according to claim 4, further comprising the step of (d) setting a recipe specifying the treatment condition calculated in said step (b) for said substrate.

6. A method of heating a substrate by irradiating the substrate with light, said method comprising the steps of:

(a) inputting a predicted reflectance of a substrate to be treated;

(b) measuring a reflectance of said substrate;

(c) making a comparison between the reflectance measured in said step (b) and said predicted reflectance; and (d) issuing an alarm when the reflectance measured in said step (b) deviates from said predicted reflectance beyond a predetermined range.

7. A heat treatment apparatus for heating a substrate by irradiating the substrate with a flash of light during a heating treatment, said heat treatment apparatus comprising:

a chamber for receiving a substrate to be treated therein;

a flash lamp for irradiating said substrate received in said chamber with a flash of light;

an input part for accepting a setting of a recipe specifying a treatment procedure and a treatment condition for said substrate;

a reflectance measuring part for measuring a reflectance of said substrate;

a temperature calculating part for calculating a predicted temperature of said substrate at a time of the heating treatment, based on the recipe set from said input part and the reflectance measured by said reflectance measuring part; and a display part for displaying the temperature of said substrate calculated by said temperature calculating part.

8. A heat treatment apparatus for heating a substrate by irradiating the substrate with a flash of light during a heating treatment, said heat treatment apparatus comprising:

a chamber for receiving a substrate to be treated therein;

a flash lamp for irradiating said substrate received in said chamber with a flash of light;

a reflectance measuring part for measuring a reflectance of said substrate;

a storage part for storing a database in which reflectances, recipes specifying treatment procedures and treatment conditions, and substrate temperatures at a time of the heating treatment are associated with each other;

an extracting part for extracting a recipe and a substrate temperature corresponding to the reflectance measured by said reflectance measuring part from said database; and a display part for displaying the recipe and substrate temperature extracted by said extracting part.

9. The heat treatment apparatus according to claim 8, further comprising a setting part for setting a given treatment condition for said substrate to be treated, based on the recipe and substrate temperature extracted by said extracting part.

10. A heat treatment apparatus for heating a substrate by irradiating the substrate with a flash of light during a heating treatment, said heat treatment apparatus comprising:

a chamber for receiving a substrate to be treated therein;

a flash lamp for irradiating said substrate received in said chamber with a flash of light;

a reflectance measuring part for measuring a reflectance of said substrate;

a treatment condition calculating part for calculating a treatment condition required for said substrate to attain a target temperature at the time of the heating treatment, based on the reflectance measured by said reflectance measuring part; and a display part for displaying the treatment condition calculated by said treatment condition calculating part, wherein said treatment condition is a discharge voltage of said flash lamp, or irradiation time period of a flash of light.

11. The heat treatment apparatus according to claim 10, further comprising a setting part for setting a recipe specifying the treatment condition calculated by said treatment condition calculating part for said substrate.

12. A heat treatment apparatus for heating a substrate by irradiating the substrate with light, said heat treatment apparatus comprising:

a chamber for receiving a substrate to be treated therein;

a light irradiator for irradiating said substrate received in said chamber with light;

an input part for accepting an input of a predicted reflectance of said substrate;

a reflectance measuring part for measuring a reflectance of said substrate;

a comparing part for making a comparison between the reflectance measured by said reflectance measuring part and said predicted reflectance; and an alarm issuing part for issuing an alarm when the reflectance measured by said reflectance measuring part deviates from said predicted reflectance beyond a predetermined range.

* * * * *